United States Patent
Ishizu et al.

(10) Patent No.: US 9,117,862 B2
(45) Date of Patent: Aug. 25, 2015

(54) SUBSTRATE PROCESSING APPARATUS, PROCESSING TUBE, SUBSTRATE HOLDER, FIXING PART OF THE SUBSTRATE HOLDER, SUBSTRATE PROCESSING METHOD, AND SUBSTRATE MANUFACTURING METHOD

(75) Inventors: Hideo Ishizu, Kawasaki (JP); Masayuki Suzuki, Hamura (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 987 days.

(21) Appl. No.: 13/201,510

(22) PCT Filed: Feb. 8, 2010

(86) PCT No.: PCT/JP2010/051809
§ 371 (c)(1), (2), (4) Date: Aug. 26, 2011

(87) PCT Pub. No.: WO2010/092930
PCT Pub. Date: Aug. 19, 2010

(65) Prior Publication Data
US 2011/0318489 A1  Dec. 29, 2011

(30) Foreign Application Priority Data
Feb. 13, 2009  (JP) .................................. 2009-030705

(51) Int. Cl.
| C23C 16/455 | (2006.01) |
| C23C 16/458 | (2006.01) |
| B25B 11/00 | (2006.01) |
| H01L 21/673 | (2006.01) |
(Continued)

(52) U.S. Cl.
CPC .... *H01L 21/67313* (2013.01); *H01L 21/67126* (2013.01); *H01L 21/67754* (2013.01); *C23C 16/4409* (2013.01); *H01J 37/32779* (2013.01)

(58) Field of Classification Search
USPC ........ 156/345.55, 345.21; 118/724, 725, 500, 118/728, 730; 269/86
See application file for complete search history.

(56) References Cited

U.S. PATENT DOCUMENTS

| 5,383,984 A * | 1/1995 | Shimada et al. ......... 156/345.26 |
| 6,159,873 A | 12/2000 | Takagi |
(Continued)

FOREIGN PATENT DOCUMENTS

| JP | A-8-330245 | 12/1996 |
| JP | A-9-167763 | 6/1997 |
(Continued)

OTHER PUBLICATIONS

International Search Report issued in International Application No. PCT/JP2010/051809 on Mar. 9, 2010 (with translation).

*Primary Examiner* — Sylvia R MacArthur
(74) *Attorney, Agent, or Firm* — Oliff PLC

(57) ABSTRACT

There is provided a substrate processing apparatus 101, comprising: a substrate holder 217 that holds a plurality of substrates (wafers) 200 in a state of being arranged in a lateral direction (approximately in a horizontal direction) approximately in a vertical posture; a processing tube 205 that houses the substrate holder 217; a throat side sealing part (throat side mechanical flange part) 2190 that air-tightly closes an opening part of the processing tube 205; a rotation part 255 that rotates the substrate holder 217 in a peripheral direction of the substrates, with an arrangement direction (a direction in which the substrates 200 are held) of the plurality of substrates 200 as a rotation axis, wherein the substrate holder 217 includes a fixing part (movable holding part 217c) and a fixture holding part 217a for fixing the substrates 200 approximately in a vertical posture.

10 Claims, 17 Drawing Sheets

(51) Int. Cl.
*H01L 21/67* (2006.01)
*H01L 21/677* (2006.01)
*H01J 37/32* (2006.01)
*C23C 16/44* (2006.01)

(56) References Cited

U.S. PATENT DOCUMENTS

| | | | | |
|---|---|---|---|---|
| 6,503,079 B2 * | 1/2003 | Kogano et al. | ............... | 432/242 |
| 8,043,431 B2 * | 10/2011 | Ozaki et al. | ............... | 118/715 |
| 8,461,062 B2 * | 6/2013 | Sakai et al. | ............... | 118/696 |
| 2009/0188431 A1 * | 7/2009 | Ozaki et al. | ............... | 118/719 |

FOREIGN PATENT DOCUMENTS

| | | |
|---|---|---|
| JP | A-2001-291761 | 10/2001 |
| JP | A-2007-329447 | 12/2007 |
| JP | A-2008-147656 | 6/2008 |
| JP | A-2008-235934 | 10/2008 |

* cited by examiner

SUBSTRATE PROCESSING APPARATUS, PROCESSING TUBE, SUBSTRATE HOLDER, FIXING PART OF THE SUBSTRATE HOLDER, SUBSTRATE PROCESSING METHOD, AND SUBSTRATE MANUFACTURING METHOD

TECHNICAL FIELD

The present invention relates to a substrate processing apparatus, a substrate processing tube, a substrate holder, a fixing part of the substrate holder, a substrate processing method, and a substrate manufacturing method.

DESCRIPTION OF RELATED ART

There is disclosed a substrate processing apparatus, with substrates (wafers) made of silicon housed in a processing tube, for processing the substrates by supplying reactive gas, etc., to the substrates in the processing tube.

For example, there is disclosed a substrate processing apparatus, with a substrate holder housed in along vertical processing tube, for holding a plurality of substrates in a state of being stacked at equal intervals in a horizontal posture, and processing the substrates in this processing tube.

SUMMARY OF THE INVENTION

Problem to be Solved by the Invention

When a substrate is processed, it is important to uniformly process the substrate in a processing tube.

However, when the substrate with relatively a large diameter of about 400 mm for example, is processed by a substrate processing apparatus including the vertical processing tube, the substrate disposed in a horizontal posture is sometimes deformed relatively largely by its own weight. Therefore, prescribed processing can not be uniformly applied to the substrate in some cases.

Therefore, an object of the present invention is to provide a substrate processing apparatus, a processing tube, a substrate holder, a fixing part of the substrate holder, a substrate processing method, and a substrate manufacturing method, capable of uniformly applying processing to the substrate, even in a case that the processing is applied to the substrate with relatively a large diameter.

Means for Solving the Problem

According to a first aspect of the present invention, there is provided a substrate processing apparatus, comprising:
a substrate holder that holds a plurality of substrates in a state of being arranged in a lateral direction (approximately in a horizontal direction) approximately in a vertical posture;
a processing tube that houses the substrate holder;
a sealing part that air-tightly closes an opening part of the processing tube;
a rotation part provided to the sealing part, for rotating the substrate holder in a peripheral direction of the substrates with an arrangement direction of the plurality of substrates as a rotation axis,
the substrate holder further comprising:
a fixing part that fixes the substrates approximately in the vertical posture.

According to other aspect of the present invention, a processing tube of the substrate processing apparatus is provided.

According to other aspect of the present invention, a fixing part of the substrate holder of the substrate processing apparatus is provided.

Advantage of the Invention

According to the substrate processing apparatus, the processing tube, the substrate holder, the fixing part of the substrate holder, the substrate processing method, and the substrate manufacturing method, processing can be uniformly applied to the substrate, even in a case that the processing is applied to the substrate with relatively a large diameter.

DESCRIPTION OF PREFERRED EMBODIMENT OF THE INVENTION

<First Embodiment of the Present Invention>

A substrate processing apparatus according to an embodiment of the present invention will be described hereafter, with reference to the drawings.

Figure 1:
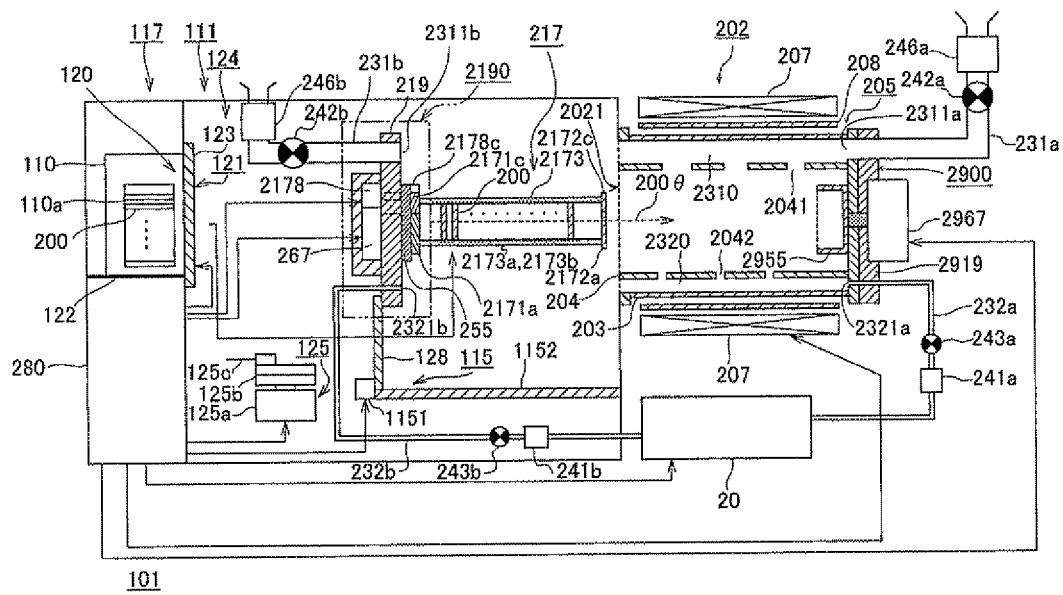
FIG. 1 is a schematic block diagram of a substrate processing apparatus according to a first embodiment of the present invention.
Figure 2:
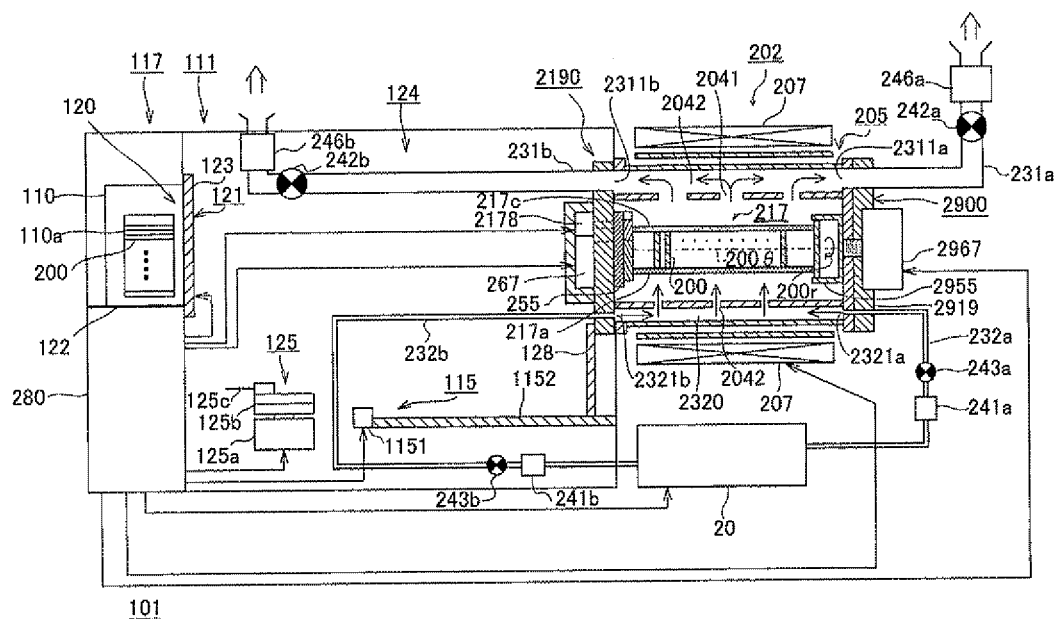
FIG. 2 is a view for explaining the substrate processing apparatus in a state that a processing tube is air-tightly closed.
Figure 3:
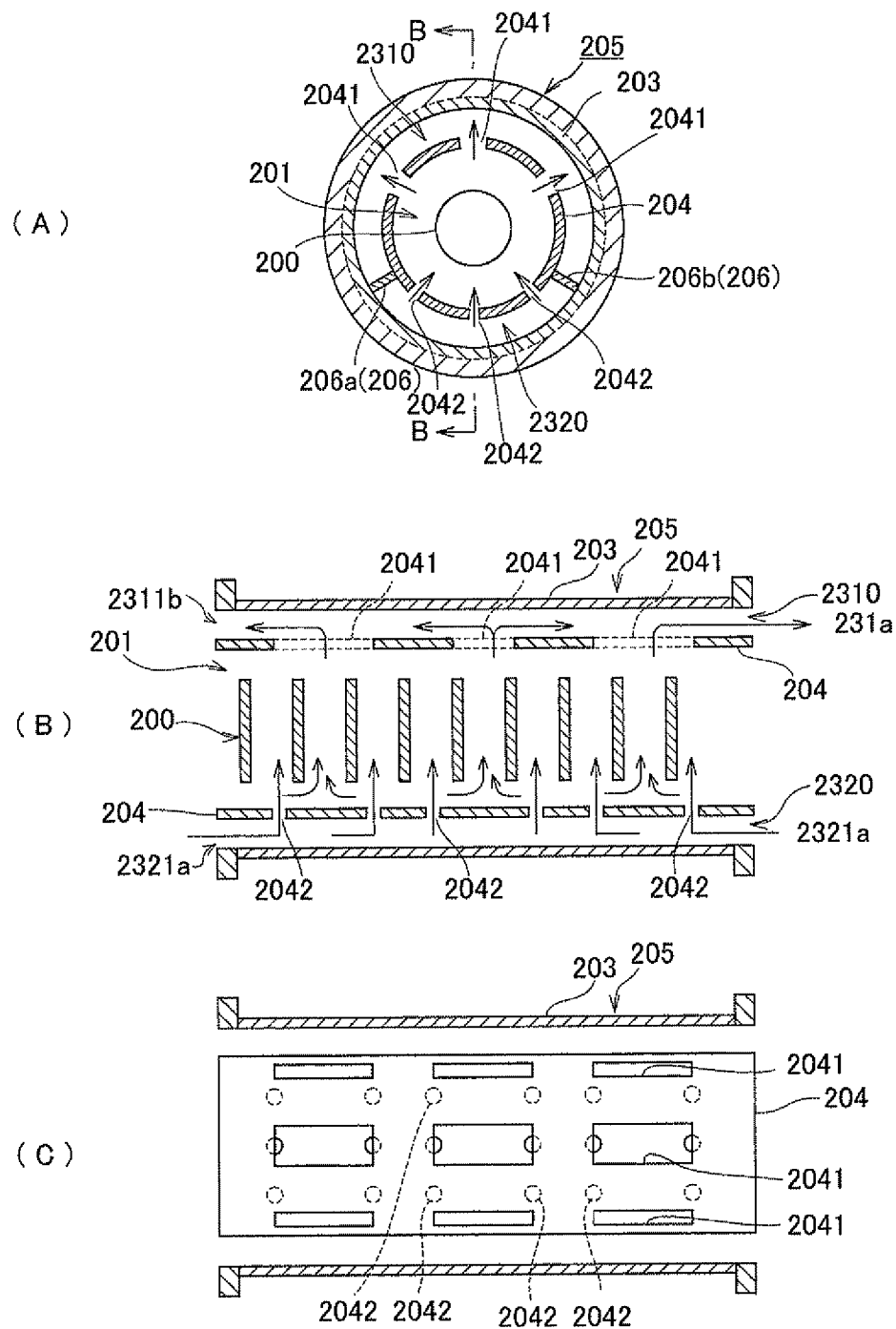
FIG. 3(A) is a view for explaining the processing tube, (B) is a sectional view of a side face of the processing tube shown in (A) taken along the line B-B, and (C) is a transparent view of the processing tube viewed from above according to an embodiment of the present invention.
Figure 4:
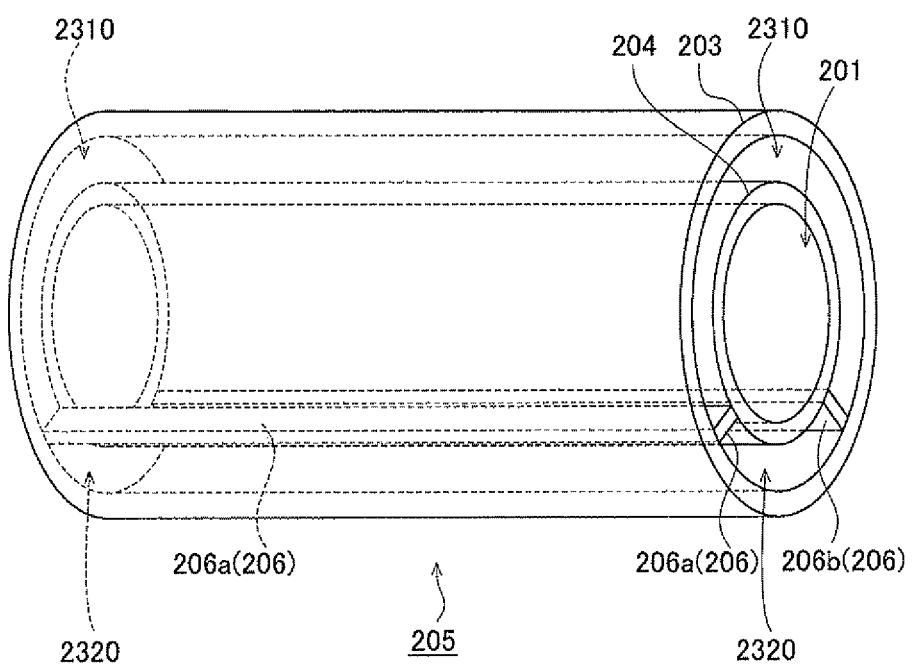
FIG. 4 is a transparent perspective view of the processing tube according to an embodiment of the present invention.

FIG. 1 is a schematic block diagram of a substrate processing apparatus 101 according to a first embodiment of the present invention. FIG. 2 is a view for explaining the substrate processing apparatus 101 in a state that a processing tube 205 is air-tightly closed. FIG. 3(A) is a view for explaining a processing tube 205. FIG. 3(B) is a sectional view of a side face of the processing tube shown in FIG. 3(A) taken along the line B-B. FIG. 3(C) is a transparent view of the processing tube 205 viewed from above, according to an embodiment of the present invention. FIG. 4 is a transparent perspective view of the processing tube 205 according to an embodiment of the present invention.

FIG. 5(A) is a front view of a throat side sealing part (sealing part) 2190 and a substrate holder 217 (in a state that a substrate (wafer) 200 is fixed). FIG. 5(B) is a sectional view of a side face of the throat side sealing part 2190 and the substrate holder 217 (in a state that the substrate is fixed). FIG. 5(C) is a front view of the throat side sealing part 2190 and the substrate holder 217 (in a state that the substrate can be attached/removed or the substrate can be housed). FIG. 5(D) is a sectional view of side faces of the throat side sealing part 2190 and the substrate holder 217 (in a state that the substrate can be attached/removed or the substrate can be housed).

FIG. 6(A) is a view for explaining the essential parts of the throat side sealing part 2190 and the substrate holder 217 of the substrate processing apparatus 101 according to an embodiment of the present invention (in a state that the substrate 200 is fixed). FIG. 6(B) is a view for explaining the essential parts of the throat side sealing part 2190 and the substrate holder 217 (in a state that the substrate 200 can be attached/removed or the substrate 200 can be housed).

(Structure of the Substrate Processing Apparatus 101)

As shown in FIG. 1 and FIG. 2, the substrate processing apparatus 101 has a front chamber 117, a transfer chamber 124, a throat side sealing part (also called a first sealing part or a throat side mechanical flange part) 2190, a tail tube side sealing part (also called a second sealing part or a tail tube side mechanical flange part) 2900, a processing furnace (reaction furnace) 202, a substrate holder 217, a gas supply unit 20, and a controller 280.

The throat side sealing part 2190 (throat side mechanical flange part) corresponds to an embodiment of the sealing part of the present invention. The substrate holder 217 corresponds to an embodiment of the substrate holder of the present invention. The processing furnace 202 has at least a heater 207, being a heating unit, and a processing tube 205. The processing tube 205 corresponds to an embodiment of the processing tube of the present invention.

(Casing 111)

As shown in FIG. 1 and FIG. 2, the substrate processing apparatus 101 according to this embodiment has a casing 111. A front chamber 117 is provided in front of the casing 111.

A wafer loading/unloading port (substrate loading/unloading port) 120 is opened on a front side wall of a front part 117, for loading and unloading the wafer (substrate) 200 made of silicon, etc., into/from the casing 111.

A front opening unified pod (FOUP) 110 (called a pod hereafter) is used as a carrier (housing container) for housing the wafer 200.

The pod 110 is formed in approximately a cubic box shape with one surface opened. A cap is removably mounted on a wafer charging/discharging port, being the opening part. A plurality of wafers 200 are vertically arranged in a cassette 110a of the pod 110 at prescribed intervals in a horizontal posture.

A pod opener 121 is installed in a wafer charging/discharging port 120. The pod opener 121 includes a placement table 122 for placing the pod 110 thereon; and a cap attaching/detaching mechanism 123 for attaching and detaching a cap (lid member) of the pod 110. The pod opener 121 is formed so that the wafer charging/discharging port of the pod 110 is opened and closed by attaching/detaching the cap of the pod 110 placed on the placement table 122, by the cap attaching/detaching mechanism 123.

(Transfer Chamber 124)

A transfer chamber 124 is provided in the rear of the front chamber 117 of the casing 111, so as to be fluidly isolated from an installment space (front chamber 117) of the wafer placement table 122. A wafer transfer mechanism (substrate transfer mechanism) 125 is provided in the transfer chamber 124. The wafer transfer mechanism 125 has a wafer transfer device (substrate transfer device) 125*a* capable of rotating or linearly moving the wafer 200 in a horizontal direction; and a transfer mechanism 125*b* for transferring the wafer transfer device 125*a*.

The transfer mechanism 125*b* is formed to charge and discharge the wafer 200 into/from the substrate holder 217 by a sequential operation of a wafer transfer device elevator 125*b* and a wafer transfer device 125*a*, with a tweezer (substrate holder) 125*c* of the wafer transfer device 125*a* as a placement part of the wafer 200.

According to this embodiment, the substrate holder 217 with wafer 200 charged therein, is configured to convert a posture from a horizontal posture to a vertical posture or convert a posture from a vertical posture to a horizontal posture. It is a matter of course that the substrate holder 217 is not limited to this embodiment. For example, the substrate holder 217 may be fixed so as to hold the wafer 200 in the vertical posture.

(Posture Conversion/Transfer Mechanism 115)

A posture conversion/transfer mechanism 115 is provided in the vicinity of (for example in a lower part of) a first sealing part 2190. For example, the posture conversion/transfer mechanism 115 has a mechanism of converting the posture between a state that the wafer 200 held by the substrate holder 217 is set in a horizontal posture, and a state that it is set in a vertical posture; and has a mechanism of transferring the first sealing part 2190. Specifically, the posture conversion/transfer mechanism 115 has an arm 128, being a connector connected to the first sealing part 2190; a posture conversion transfer drive part 1151; and a transfer guide member 1152.

(First Sealing Part (Throat Side Mechanical Flange Part) 2190)

A throat (opening part) 2021 side of the processing furnace 202 is closed by the first sealing part 2190. By this first sealing part 2190, the substrate holder 217 is rotatably held, so that the opening part 2021 of the processing furnace 202 can be air-tightly closed. Specifically, the first sealing part 2190 includes a seal flange (throat side seal flange) 219; and a rotation part 255 for rotatably holding the substrate holder 217. Each constitutional element of the first seal part 2190 will be described later.

The substrate holder 217 includes a plurality of holding members (for example, struts), so that a plurality of (for example, about 20 to 150 sheets of) wafers 200 are held to be arranged in a lateral direction (approximately in a horizontal direction) with their centers aligned approximately in a vertical posture. A detailed structure of the substrate holder 217 will be described later.

(Processing Furnace 202)

The processing furnace 202 is provided in the rear (right side in FIG. 1) of the casing 111. The processing furnace 202 is formed in a cylindrical shape. The processing furnace 202 according to this embodiment includes the processing tube 205, being a reaction tube. A throat (opening part) 2021 is provided at one of the end portions of the processing tube 205 in an axial direction. A second sealing part (tail tube side mechanical flange part) 2900 is provided on the other end portion of the processing tube 205 in the axial direction. The structure of the second sealing part 2900 will be described later.

(Gas Supply Part 2320 and a Gas Exhaust Part 2310)

According to this embodiment, as shown in FIG. 1, FIG. 2, FIG. 3(A) to FIG. 3(C), there are provided a gas supply part 2320 including one or more gas supply ports 2042, between an inner wall of the processing tube 205 and the wafers 200 held by the substrate holder 217, extending along a direction (approximately in a horizontal direction) in which the wafers 200 are arranged; and a gas exhaust part 2310 including one or more gas exhaust ports 2041, between the inner wall of the processing tube 205 and the wafers 200 held by the substrate holder 217, extending along an arrangement direction of the wafers 200 (a direction in which the wafers 200 are held by the substrate holder 217), at a position opposed to the gas supply ports 2042 through the wafers 200.

For example, a plurality of gas supply ports 2042 may be formed along the arrangement direction of the wafers 200, or one or more elongate shaped gas supply ports 2042 may be formed along the arrangement direction of the wafers 200.

Further, for example, a plurality of gas exhaust ports 2041 may be formed along the arrangement direction of the wafers 200, or one or more elongate shaped gas exhausts ports 2041 may be formed along the arrangement direction of the wafers 200.

As shown in FIG. 3(B), gas (processing gas, etc.) is supplied to a surface (main surface) 200S of the wafer 200 in parallel thereto, by flowing the gas (processing gas, etc.) toward the gas exhaust ports 2041 from the gas supply ports 2042 (side flow structure).

For example, a diameter of each of the plurality of gas supply ports 2042 may be set to supply the gas of approximately the same flow rate, to each of the plurality of wafers 200 held by the substrate holder 217.

Further, for example, a diameter of each the plurality of gas exhaust ports 2041 may be set to exhaust the gas of approximately the same flow rate, to each of the plurality of wafers 200 held by the substrate holder 217.

Further, for example, a diameter of each of the plurality of gas supply ports 2042 and gas exhaust ports 2041 may be set to supply the gas of approximately the same flow rate, to each of the plurality of wafers 200 held by the substrate holder 217.

The gas supply ports 2042 and the gas exhaust ports 2041 are suitably set according to a processing condition for applying processing to the wafers 200.

(Processing Tube 205)

According to an embodiment of the present invention, a double tube is employed as the processing tube 205, as shown in FIG. 1, FIG. 2, FIG. 3(A) to FIG. 3(C), and FIG. 4.

The processing tube 205 of this embodiment includes a cylindrical inner tube 204 in which the substrate holder 217 holding the wafers 200 is housed; a cylindrical outer tube 203 that surrounds the inner tube 204; and a partitioning plate 206 as will be described later. Each one of the inner tube 204 and the outer tube 203 is made of a non-metal material having heat resistance such as quartz ($SiO_2$) and silicon carbide (SiC), and is formed in a cylindrical shape with one end portion closed and the other end portion opened.

A processing chamber 201 is formed in a hollow part of a cylinder of the inner tube 204. The inner tube 204 is formed to be housed in the processing chamber 201 in a state that the wafers 200, being substrates, are horizontally arranged in a vertical posture by the substrate holder 217.

A heater, being a heating unit, is provided on an outer periphery of the processing tube 205 (outer tube 203) concentrically with the processing tube 205. The heater 207 is formed in a cylindrical shape.

A soaking pipe 208 for uniformly irradiating the processing tube 205 with heat ray (electromagnetic wave) from the heater 207, is provided between the processing tube 205 and the heater 207.

The inner tube 204 and the outer tube 203 are concentrically arranged. Further, the inner tube 204, the outer tube 203, and the wafer 200 held by the substrate holder 217 disposed in the inner tube 204, are concentrically arranged. Further, the processing tube 205, the heater 207, and the soak pipe 208 are also concentrically arranged.

(Partitioning Plate 206)

As shown in FIG. 3(A) and FIG. 4, the processing tube 205 of this embodiment has a partitioning plate 206 (206a, 206b) that partitions a space between the inner tube 204 and the outer tube 203, into the gas supply part 2320 and the gas exhaust part 2310, extending along the arrangement direction of the plurality of wafers 200. The partitioning plate 206 is formed in a rectangular shape for example, and is made of the non-metal material having heat resistance such as quartz ($SiO_2$) and silicon carbide (SiC). The partitioning plate 206 is bonded to a prescribed position of each of the inner tube 204 and the outer tube 203.

According to this embodiment, as shown in FIG. 3(A) and FIG. 4, in the space between the inner tube 204 and the outer tube 203, the gas supply part 2320 is formed in a space of a lower side of a horizontal surface passing through a central axis of the inner tube 204, and the gas exhaust part 2310 is formed in the other space.

For example, according to this embodiment, in the space between the inner tube 204 and the outer tube 203, the percentage of the space occupied by the gas supply part 2320 is about 33%, and the percentage of the space occupied by the gas exhaust part 2310 is about 67%. The percentage of the gas supply part 2320 and the percentage of the gas exhaust part 2310 are suitably set.

(Gas Supply Port 2042 and Gas Exhaust Port 2041)

As shown in FIG. 1, FIG. 2, FIG. 3(A) to FIG. 3(C), the inner tube 204 includes a gas supply port 2042 that allows communication between an inside of the gas supply part 2320 and an inside of the inner tube 204; and the gas exhaust port 2041 that allows communication between an inside of the gas exhaust part 2310 and an inside of the inner tube 204.

A pressure inside of the gas exhaust part 2310 is set to be lower than the inside of the gas supply part 2320. As shown in FIG. 2, FIG. 3(A), FIG. 3(B), gas is supplied to the surface (main surface) of the wafer 200 in parallel thereto, by flowing the gas (processing gas, etc.) toward the gas exhaust port 2041 of the gas exhaust part 2310, from the gas supply port 2042 of the gas supply part 2320.

Further, according to this embodiment, as shown in FIG. 2, FIG. 3(A), and FIG. 3(B), the gas supply port 2042 is formed at a lower side of the horizontal surface passing through a center axis of the inner tube 204, and the gas exhaust port 2041 is formed on an upper side of the horizontal surface passing through the center axis of the inner tube 204. The gas is supplied to the upper side from the lower side of the wafer 200 in parallel to the surface (main surface) of the wafer 200, by flowing the gas (processing gas, etc.) to the gas exhaust port 2041 provided on the upper side of the inner tube 204, from the gas supply port 2042 provided on the lower side of the inner tube 204.

Diameters and positions of the gas supply port 2042 and the gas exhaust port 2041 are set to supply the gas of approximately the same flow rate, to each of the plurality of wafers 200 held by the substrate holder 217.

According to this embodiment, for example as shown in FIG. 3(A) to FIG. 3(C), a plurality of circular gas supply ports 2042 are formed at equal intervals with respect to the center axis of the inner tube 204, and are formed in a plurality of rows (for example three rows) at approximately equal intervals in a peripheral direction. Further, a plurality of rectangular gas exhaust ports 2041 are formed at approximately equal intervals with respect to the center axis of the inner tube 204, and are formed in a plurality of rows (for example three rows) at approximately equal intervals in the peripheral direction.

Further, according to this embodiment, a length along a longitudinal direction (direction of holding the wafer 200) of the gas exhaust port 2041, are set to be the same as the length between the adjacent gas supply ports 2042 along the longitudinal direction. Further, the length between the adjacent gas exhaust ports 2041 along the longitudinal direction, is set to be the same as the length between the plurality of adjacent gas supply ports 2042 along the longitudinal direction.

The gas supply port 2042 and the gas exhaust port 2041 are not limited to this embodiment. For example, the gas supply port 2042 (gas exhaust port 2041) may also be provided at a position corresponding to a part where each of the plurality of wafers 200 is held. In this case, the number of wafers 200 and the number of gas supply ports 2042 (gas exhaust ports 2041) is preferably the same.

Further, for example, when the processing tube 205 is visually recognized from above, the gas supply port 2042 may also be arranged at a position corresponding to an inside of the opening region of the gas exhaust port 2041.

(Structure of the Substrate Holder 217)

As shown in FIG. 2, the substrate holder 217 for holding a plurality of wafers 200 can be disposed inside of the inner tube 204 (inside of the processing chamber 201). As shown in FIG. 1, FIG. 2, FIG. 5(A) to FIG. 5(D), and FIG. 6(A) to FIG. 6(B), the substrate holder 217 is formed so that one or more (for example, about 20 to 150 sheets) of wafers 200 are held in a state of being arranged in the lateral direction (approximately in the horizontal direction) at prescribed intervals (substrate pitch intervals) approximately in a vertical posture. Specifically, the substrate holder 217 is formed so that the plurality of wafers 200 are held by arranging them at equal intervals the lateral direction (horizontal direction), with their centers aligned approximately in the vertical posture.

The substrate holder 217 of this embodiment has a fixing part for fixing the plurality of wafers 200 approximately in the vertical posture. Specifically, the fixing part is formed to fix the plurality of wafers 200 approximately in the vertical posture even in a rotation state by the rotation part 255 as will be described later. Namely, even if the substrate holder 217 is rotated, the wafer 200 is prevented from dropping from the substrate holder 217.

Specifically, as shown in FIG. 5(A) to FIG. 5(D), FIG. 6(A), FIG. 6(B), the substrate holder 217 has a fixture holding part 217 and a movable holding part 217c for supporting a side face of the wafer 200. The movable holding part 217c corresponds to an embodiment of the fixing part of the present invention.

The movable holding part 217c is formed so that it can be displaced between a state that the wafer 200 is fixed by holding other side face portion different from the side face of the wafer 200 held by the fixture holding part 217a, and a state that the wafer 200 can be removed.

Each constitutional part of the substrate holder 217 will be described hereafter, with reference to FIG. 5(A) to FIG. 5(D), and FIG. 6(A), FIG. 6(B).

(Fixture Holding Part 217a)

A fixture holding part 217a has a pair of end plates 2171a, 2172a, and a plurality of (for example two) struts 2173 (2173a, 2173b) erected between the end plates 2171a and 2172a. The end plates 2171a and 2172a are formed approximately in disc shapes.

For example, at least two or more struts 2173 (2173a, 2173b) of the fixture holding part 217a are provided to be positioned in a lower side of a horizontal position passing through the center of the wafer 200, in a state that the wafer 200 is housed in the substrate holder 217.

Holding grooves 217h of the struts 2173a, 2173b are formed at a part in contact with the wafer 200 at equal intervals along the longitudinal direction of the struts. The wafer 200 is held approximately in a vertical posture by inserting the side face of the wafer 200 into the holding grooves 217h of the struts 2173a, 2173b.

(Movable Holding Part 217c)

A movable holding part 217c has a pair of end plates 2171c, 2172c, and one or more (one in this embodiment) strut 2173c erected between the end plates 2171c and 2172c. The end plates 2171c, 2172c are formed approximately in semicircular shapes.

The approximately circular-shaped end plate 2171c of the movable holding part 217c, and the approximately circular-shaped end plate 2171a of the fixture holding part 217a are formed to be set in a circular shape with each straight line portion aligned. Further, the approximately circular-shaped end plate 2172c of the movable holding part 217c and the approximately circular-shaped end plate 2172a of the fixture holding part 217a are formed to be set in a circular state with each straight line portion aligned.

A plurality of holding grooves 217h are formed on the strut 2173c of the movable holding part 217c, so as to be arranged at equal intervals along the longitudinal direction of the strut 2173c. Specifically, the holding grooves 217h of the strut 2173c are formed at positions corresponding to positions where the holding grooves 217h of the struts 2173a, 2173b are formed.

Further, the movable holding part 217c preferably has at least one or more struts 2173c on the upper side of the horizontal position passing through the center of the wafer 200 held on the struts 2173a, 2173b.

As shown in FIG. 1, FIG. 2, FIG. 5(A), FIG. 5(B), and FIG. 6(A), the substrate holder 217 of this embodiment fixes the wafer 200 approximately in a vertical posture, by sandwiching an upper side and a lower side of the side face of the wafer 200 by the strut 2173c of the movable holding part 217c.

Note that according to this embodiment, the side face of the wafer 200 is held at three places by struts 2173a, 2173b, and 2173c. However, the embodiment is not limited thereto. For example, the side face of the wafer 200 may be held at four places by four or more struts.

As shown in FIG. 5(A) to FIG. 5(D), and FIGS. 6(A), 6(b), according to this embodiment, the movable holding part 217c is formed rotatably by about 90° (within a range of allowing the substrate to be removed) from a range of a prescribed angle (for example 0° (an angle for fixing the substrate), with a rotation axis 2178d as a center, which is formed near the peripheral part of the movable holding part 217c. Note that an upper limit of a movable range of the movable holding part 217c may also be 90° or more.

In this embodiment, the rotation axis 2178d is positioned near a part at which the end plate 2171a of the fixture holding part 217a and the end plate 2171c of the movable holding part 217c are bonded to each other.

Further, according to this embodiment, an arc-shaped outer peripheral holding member 2178c is provided to be bonded to a part or an entire part of the outer peripheral part of the end plate 2171c. An end portion of the outer peripheral holding member 2178c is bonded to the rotation axis 2178d. The outer peripheral holding member 2178c is formed rotatable by a prescribed angle, for example, within a range from 0° to 90°, with the rotation axis 2178d as a center.

Each constitutional element of the substrate holder 217, specifically, the end plates 2171a, 2172a and the struts 2173 (2173a, 2173b) of the fixture holding part 217a, the strut 2173c of the end plates 2171c, 2172c of the movable holding part 217c, and the outer peripheral holding member 2178c, are made of a heat resistant material such as quartz ($SiO_2$) or silicon carbide (SiC).

(Drive Part 2178)

For example, a drive part (drive motor) 2178 may be provided to the outer peripheral holding member 2178c. In this embodiment, the drive part 2178 is provided at a front side (a side of a face opposed to a face on which the substrate holder 217 is provided) of a seal flange 219 through the rotation axis 2178d. The drive part 2178 is controlled by a controller 280. The movable holding part 217c is rotated through the outer peripheral holding member 2178c, by rotating the rotation axis 2178d by the drive part 2178.

(Auxiliary Fixing Part 2179)

Further, as shown in FIG. 5(A), an auxiliary fixing part 2179 such as a hook for making a fixture state with the fixture holding part 217a and the movable holding part 217c bonded to each other, may be provided to the fixture holding part 217a or the movable holding part 217c. For example, a hook for fixing the endplate 2171a and the end plate 2171c, or a hook for fixing the end plate 2172a and the endplate 2172c, may also be provided as the auxiliary fixing part 2179.

Namely, the fixture holding part 217a and the movable holding part 217c are fixed by the auxiliary fixing part 2179 in a state that the wafer 200 is sandwiched by the fixture holding part 217a and the movable holding part 217c. Therefore, the fixture holding part 127a and the movable holding part 217c are prevented from being separated from each other during rotation of the substrate holder 217.

(Operation of the Substrate Holder 217)

Next, an operation of the substrate holder 217 will be described hereafter, with reference to the drawings.

(A State that the Wafer 200 can be Housed in the Substrate Holder 217, or a State that the Wafer 200 can be Removed)

When the wafer 200 is housed in the substrate holder 217, or when the wafer 200 is removed from the substrate holder 217, as shown in FIG. 5(C), FIG. 5(D), and FIG. 6(B), the movable holding part 217c is positioned at a specified position so that the wafer 200 can be housed.

Specifically, for example, by controlling the drive part (drive motor) 2178 by the controller 280, the end plate 2171c of the movable holding part 217c is rotated by about 90° from a reference position (position for sandwiching the wafer 200), with the rotation axis 2178d as a center. In this state, the wafer 200 is housed in the fixture holding part 2171a, or the wafer 200 is removed from the fixture holding part 2171a.

(A State of Fixing the Wafer 200)

When the wafer 200 is fixed to the substrate holder 217, as shown in FIG. 5(A), FIG. 5(B), and FIG. 6(A), the movable holding part 217c is positioned at a specified position, so as to sandwich the wafer 200 by the movable holding part 217c and the fixture holding part 217a.

Specifically, the end plate 2171c of the movable holding part 217c is rotated in a reverse direction to the aforementioned rotation with the rotation axis 2178d as a center, by controlling the drive part (drive motor) 2178 by the controller 280.

Then, the side face of the wafer 200 is sandwiched by a plurality of struts 2173a, 2173b, and 2173c, so that a plurality of wafers 200 are fixed to the substrate holder 217 in a state of being arranged in approximately the horizontal direction approximately in the vertical posture.

Figure 5:
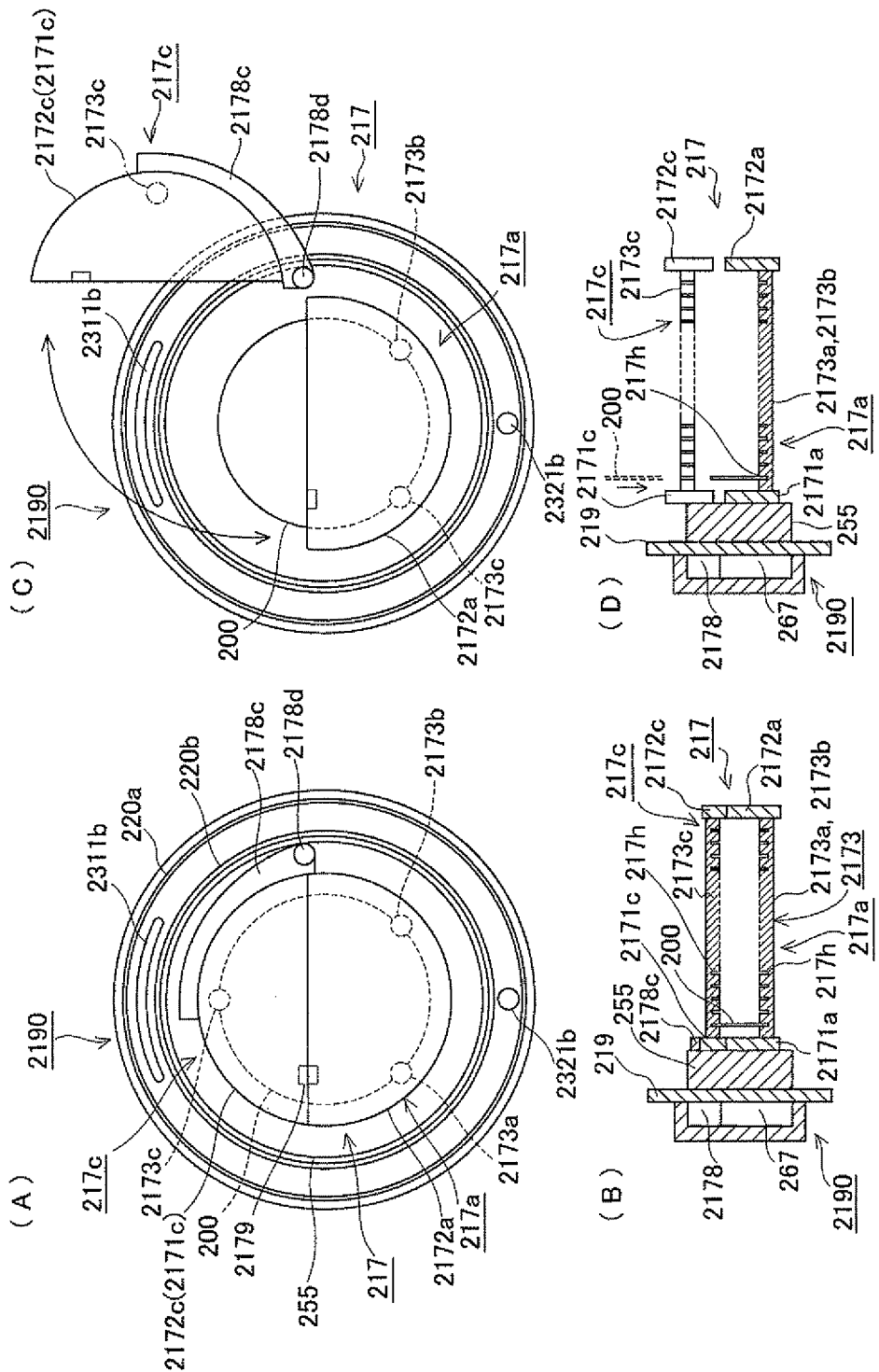
FIG. 5(A) is a front view of a throat side seal flange part (in a state that a substrate is fixed), (B) is a sectional view of a side face of the throat side seal flange part (in a state that the substrate is fixed), (C) is a front view of the throat side seal flange part and the substrate holder (in a state that the substrate can be attached/removed or the substrate can be housed), and (D) is a sectional view of the side face of the throat side seal flange part (in a state that the substrate can be attached/removed or the substrate can be housed).
Figure 6:
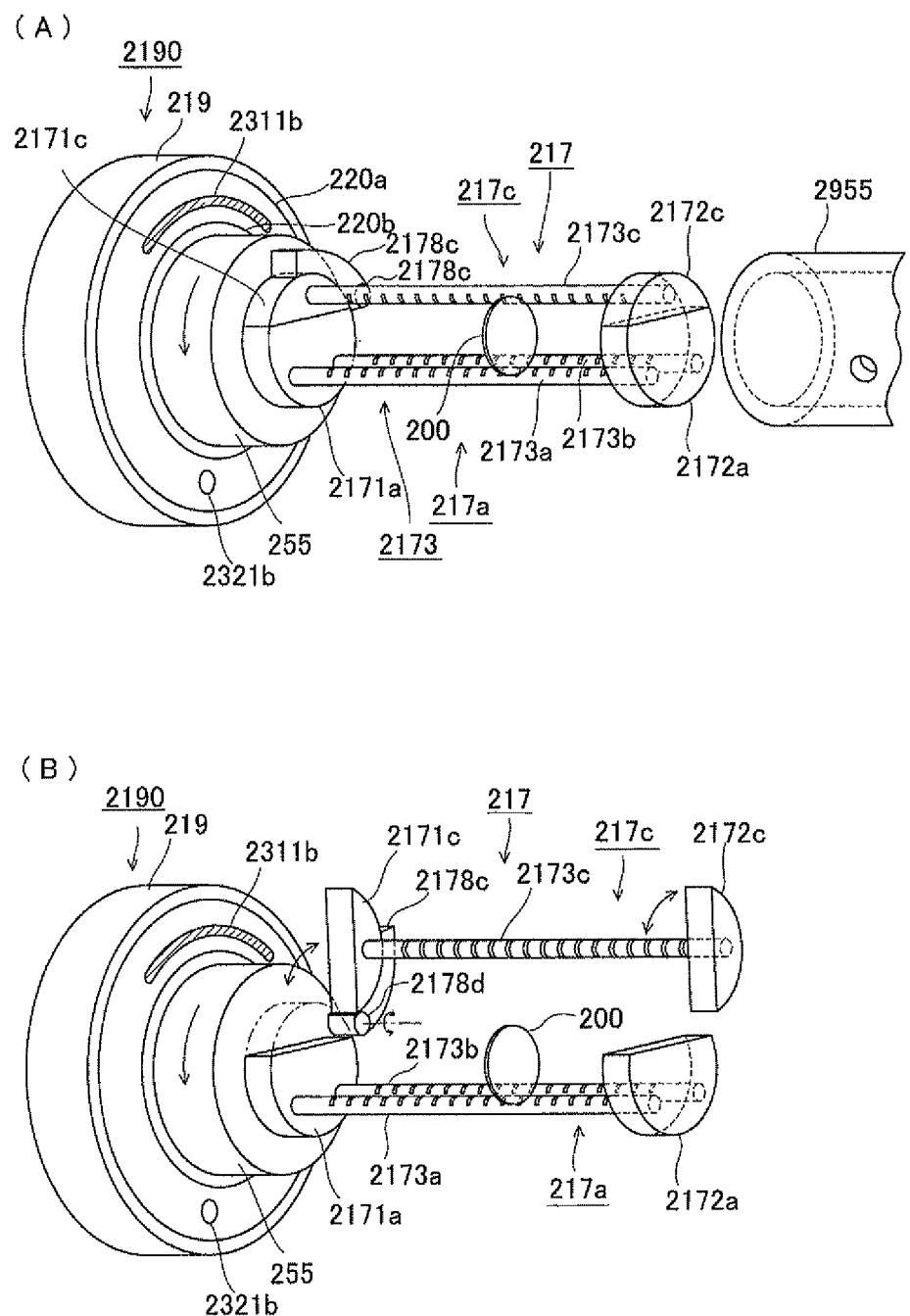
FIG. 6 (A) is a view for explaining essential parts of the throat side sealing part and the substrate holder of the substrate processing apparatus according to an embodiment of the present invention (in a state that the substrate is fixed), and (B) is a view for explaining the essential parts of the throat side sealing part and the substrate holder (in a state that the substrate can be attached/removed or the substrate can be housed).

Note that as shown in FIG. 5 and FIG. 6, the wafer 200 is held by the substrate holder 217 in a state of being arranged in the lateral direction, and this state may be realized by performing the following operation. Specifically, for example, when the wafer 200 is held by the substrate holder 217, the wafer 200 is held by the substrate holder 217 approximately in the vertical posture in a state of being arranged in multiple stages in a vertical direction approximately in the horizontal posture, then the wafer 200 is fixed to the substrate holder 217 by moving the movable holding part 217c to a specified position, and thereafter as shown in FIG. 5 and FIG. 6, the wafer 200 may be held in a state of being arranged in the lateral direction by the substrate holder 217 which is set in the horizontal posture.

(Rotation Part 255)

A rotation part (rotation support part) 255 for rotating the substrate holder 217 is provided to the first sealing part 2190 in a peripheral direction 200r of the wafer 200, with an arrangement direction of the plurality of wafers 200 (a direction in which the plurality of wafers 200 are held by the substrate holder 217) as a rotation axis. The arrangement direction of the plurality of wafers 200 (a direction in which the plurality of wafers 200 are held by the substrate holder 217) is set as an axis (rotation axis) 200θ. The rotation part 255 corresponds to an embodiment of the rotation support part of the present invention.

Specifically, the rotation part 255 provided to the first sealing part 2190 rotatably supports the end portion along the axial direction of the substrate holder 217. The rotation axis 200θ of the rotation part 255 is formed as a center of the wafer 200, and a center of the processing tube 205 (inner tube 204 and outer tube 203). Further, the rotation part 255 of this embodiment is formed to pass through the center part of the seal flange 219 for example. Moreover, a rotation mechanism (drive motor, etc.) 267 for rotating the rotation part 255 is provided at the front side of the seal flange 219 (the side opposed to the installment surface side of the substrate holder 217).

(Structure of the Seal Flange 219)

The seal flange 219 is a throat lid member capable of air-tightly closing the throat (opening part) 2021 of the processing tube 205. Specifically, the seal flange 219 is formed in contact with the opening part 2021 of the processing tube 205. The seal flange 219 is made of a metal material such as stainless, and is formed in a disc shape.

(The Gas Supply Port and the Gas Exhaust Port of the Throat Side Seal Flange 219)

According to this embodiment, as shown in FIG. 1, FIG. 2, FIG. 5(A), FIG. 5(C), FIG. 6(A), and FIG. 6(B), a gas supply port 2321b is formed on the throat side seal flange 219 of the throat side sealing part 2190 so as to communicate with the gas supply part 2320 of the processing tube 205, and a gas exhaust port 2311b is formed on an upper side of a surface of an inner throat side of the flange so as to communicate with the gas exhaust part 2310 of the processing tube 205.

O-rings 220a, 220b, being seal members, are formed on the side face of the seal flange 219 in contact with the end portion of the processing tube 205.

(Outer Seal O-ring 220a)

Specifically, as shown in FIG. 5(A), FIG. 5(C), FIG. 6(A), and FIG. 6(B), an O-ring (outer seal O-ring) 220a, being a seal member, is provided between the outer peripheral part of a surface of a throat inner surface side of the throat side seal flange 219, and a gas exhaust port 2311a (and the gas supply port 2321b). When the throat is air-tightly closed, the outer seal O-ring 220a is positioned between the throat side seal flange 219 and the outer tube 203.

(Inner Seal O-ring 220b)

Specifically, as shown in FIG. 5(A), FIG. 5(C), FIG. 6(A), and FIG. 6(B), the O-ring (inner seal O-ring) 220b, being the seal member, is provided between the gas exhaust port 2311a (and the gas supply port 2321b) formed on the surface of the throat inner surface side of the throat side seal flange 219, and the rotation part 255. When the throat is air-tightly closed, the inner seal O-ring 220b is positioned between the throat side seal flange 219 and the inner tube 204.

(Operation of the Seal Flange 219)

The seal flange 219 is formed so that the substrate holder 217 can be loaded and unloaded into/from the processing chamber 201. Further, as described above, the controller 280 is electrically connected to the rotation mechanism 267 and the posture conversion/transfer mechanism 115, and under control of the controller 280, a desired operation is performed at a desired timing. Namely, the seal flange 219 is formed to be rotated or transferred in the horizontal direction (lateral direction) by the posture conversion/transfer mechanism 115 provided outside of the processing tube 205.

When a plurality of wafers 200 are charged into the substrate holder 217 (wafer charge), the substrate holder 217 holding the plurality of wafers 200 is transferred by the posture conversion/transfer mechanism 115 and is loaded into the processing chamber 201. The seal flange 219 closes the end portion of the processing tube 205 air-tightly through the O-rings 220a, 220b.

(Second Sealing Part 2900 (Tail Tube Side Seal Flange Part))

As shown in FIG. 1 and FIG. 2, the second sealing part (tail tube side seal flange part) 2900 is provided at the end portion side (also called the tail tube side) opposed to the end portion where the throat 2021 is formed, out of both end portions along the longitudinal direction of the processing furnace 202.

A tail side seal flange 2919 of the second sealing part 2900 air-tightly closes the end portion at the tail tube side of the inner tube 204 and the end portion at the tail tube side of the outer tube 203 respectively.

(Rotation Support Part 2955)

As shown in FIG. 1 and FIG. 2, a rotation support part 2955 for rotatably supporting the end portion at the tail tube side of the substrate holder 217, is provided in the seal flange 2919.

Namely, according to this embodiment, both end portions along a rotation axial direction of the substrate holder 217 are rotatably supported by the rotation support part (rotation part 255, the tail tube side rotation support part (rotation support part) 2955) provided at both end portions of the processing tube 205 respectively.

The rotation support part 2955 rotatably supports the endplates 2172a, 2172c of the substrate holder 217. For example, as shown in FIG. 1, FIG. 2, and FIG. 6(A), the rotation support part 2955 is formed in a shape (for example, in a cylindrical shape) for supporting the outer peripheral parts of the endplate 2172a and the endplate 2172c respectively in a state that they are bonded to each other. Further, for example, an arm, etc., may be provided for sandwiching the end plates 2172a, 2172c.

According to this embodiment, for example, the rotation support part 2955 is provided to pass through the center part of the seal flange 2919. The seal flange 2919 is provided with a rotation mechanism (drive motor, et.) 2967 for rotating the rotation support part 2955 on the surface opposed to the surface on which the rotation support part 2955 is provided. The rotation mechanism 2967 is controlled by the controller 280. Note that the rotation support part 2955 is not limited to this embodiment. The rotation support part 2955 may be rotated together with the rotation of the substrate holder 217 while supporting the substrate holder 217.

(Tail Tube Side Seal Flange 2919)

Further, as shown in FIG. 1 and FIG. 2, a gas supply port 2321a is formed at a lower side of the throat inner surface side of the flange so as to communicate with the gas supply part 2320 of the processing tube 205, and a gas exhaust port 2311a is formed on an upper side of the throat inner surface side of the flange so as to communicate with the gas exhaust part 2310 of the processing tube 205.

(Gas Supply System)

Next, a gas supply system for supplying gas (reactive gas or inert gas, etc.) into the processing tube 205 will be described, with reference to the drawings.

According to this embodiment, as shown in FIG. 1 and FIG. 2, gas supply lines are respectively provided at both end portions along an axial direction of the processing tube 205. The gas supply lines are not only provided at both end portions along the axial direction of the processing tube, but also may be provided to only one of the end portions. In this embodiment, gas supply can be changed to either one of the one side supply and both sides supply.

The structure of the gas supply line will be described hereafter, with reference to the drawings.

(Gas Supply Unit 20)

As shown in FIG. 1 and FIG. 2, the gas supply unit 20 includes a reactive gas supply source for supplying reactive gas such as oxygen gas and hydrogen gas, and a carrier gas supply source for supplying carrier gas (Inert gas such as $N_2$ gas). In this embodiment, the gas supply unit 20 is provided outside of the transfer chamber 124.

(Tail Tube Side Gas Supply Line)

According to this embodiment, as shown in FIG. 1 and FIG. 2, an upper stream side of the gas supply line (gas introduction line) 232a connected to the tail tube side seal flange 2919, is connected to the gas supply unit 20. A liquid mass flow controller (LMFC) 241a and an open/close valve 243a are provided on the gas supply line 232a, from the upper stream side. By opening the open/close valve 243a, gas is supplied to the gas supply part 2320 of the processing tube 205, from the gas supply unit 20, through the tail tube side gas supply port (introduction port) 2321a.

(Throat Side Gas Supply Line)

According to this embodiment, as shown in FIG. 1 and FIG. 2, the upper stream side of the gas supply line (gas introduction tube) 232b connected to the throat side seal flange 219, is connected to the gas supply unit 20. LMFC 241B and an open/close valve 243b are provided on the gas supply line 232b, from the upper stream side. By opening the open/close valve 243b, gas is supplied to the gas supply part 2320 of the processing tube 205, from the gas supply unit 20, through the tail tube side gas supply port (introduction port) 2321b.

The controller 280 is electrically connected to the LMFC 241a and the LMFC 241b, and under control of the controller 280, the gas of a prescribed amount of flow rate is supplied at a desired timing. Note that in this embodiment, the flow rate is controlled by the liquid mass flow controller. However, the present invention is not limited to this embodiment, and for example, the flow rate may also be controlled by a mass flow controller (MFC).

(Gas Exhaust System)

Next, a gas exhaust system exhausting the gas in the processing tube 205 will be described, with reference to the drawings.

According to this embodiment, as shown in FIG. 1 and FIG. 2, gas exhaust lines are provided at both end portions of the processing tube 205. The gas exhaust lines are not only provided at both end portions along the axial direction of the processing tube 205, but also may be provided at only one of the end portions. In this embodiment, gas exhaust can be changed to either one of the one side exhaust and both sides exhaust.

The structure of the gas exhaust line will be described hereafter, with reference to the drawings.

(Tail Tube Side Gas Exhaust Line)

According to this embodiment, as shown in FIG. 1 and FIG. 2, the gas exhaust line 231a is connected to the tail tube side seal flange 2919. Specifically, the gas exhaust line 231a is connected to the gas exhaust port 2311a of the tail tube side seal flange 2919, and the gas exhaust line 231a is connected to a vacuum pump 246a through the valve 242a.

(Throat Side Gas Exhaust Line)

A gas exhaust line 231b exhausting inside of the gas exhaust part 2310 of the processing furnace 202 is connected to the throat side seal flange 219. Specifically, the gas exhaust line 231b is connected to the gas exhaust port 2311b of the throat side seal flange 219, and the gas exhaust line 231b is connected to a vacuum pump 246b through a valve 242b.

(Controller 280)

The controller 280, being a control part, is connected to the heater 207, vacuum pumps 246a, 246b, rotation mechanism 267, posture conversion/transfer mechanism 115, open/close valves 242a, 242b, 243a, 243b, LMFCs 241a, 241b, etc.

The controller 280 performs control of the present invention, such as a control of housing the wafer 200 into the substrate holder 217, a control of making the movable holding part 217c of the substrate holder 217 set in a movable state by driving the drive part 2178, a control of rotating the rotation part 255, and a control of supplying gas by the gas supply unit 20.

The controller 280 controls temperature adjustment operation of the heater 207, start/stop of the vacuum pumps 246a, 246b, rotation control of the rotation mechanism 267, posture conversion control and a transfer operation of the posture conversion/transfer mechanism 115, open/close operation of the open/close valves 242a, 242b, 243a, 243b, and flow rate adjustment of the LMFCs 241a, 241b.

(Operation of the Substrate Processing Apparatus 101)

Figure 7:
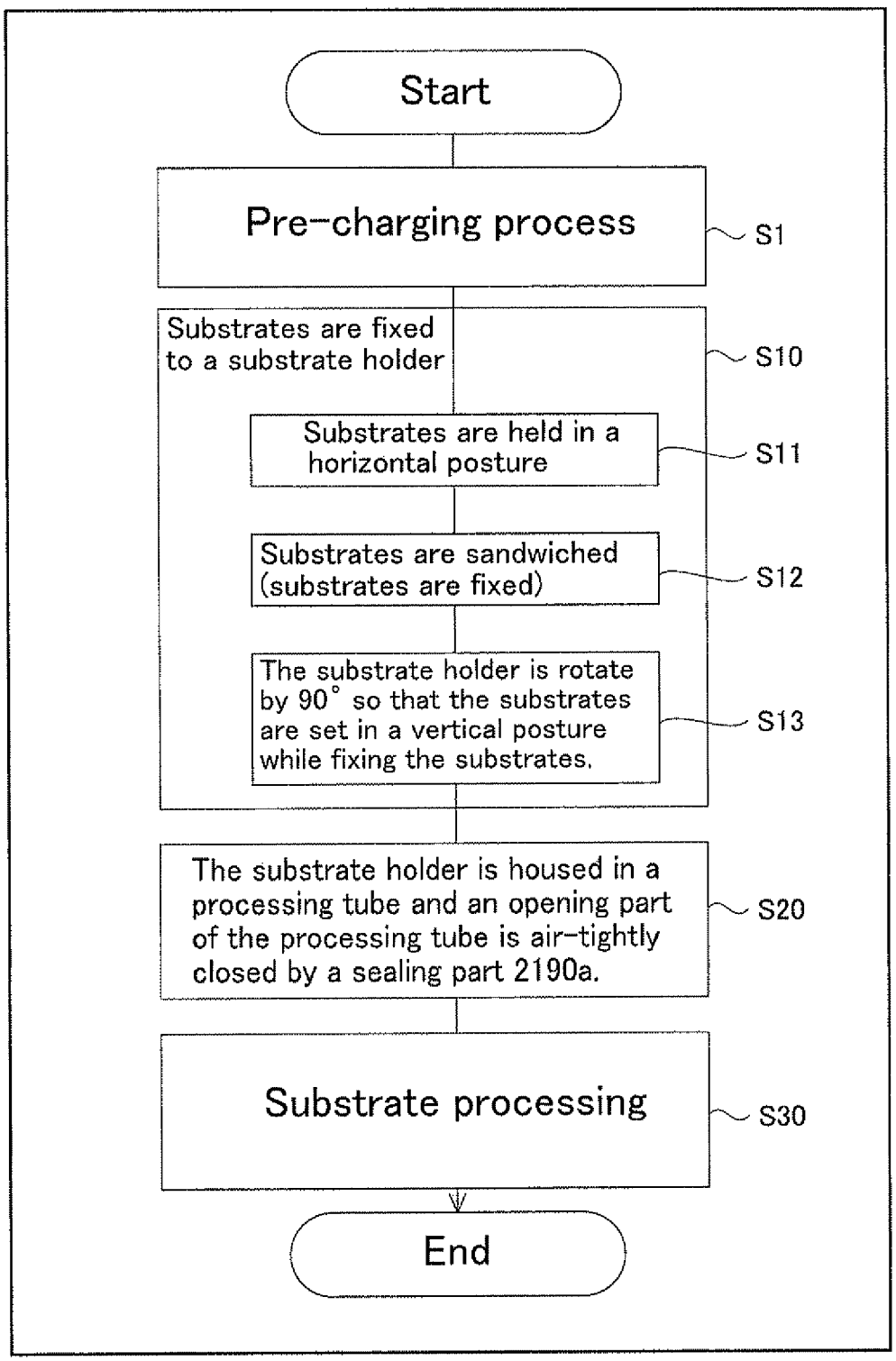
FIG. 7 is a flowchart for explaining an operation of the substrate processing apparatus according to an embodiment of the present invention.

Next, an operation of the substrate processing apparatus 101 according to an embodiment of the present invention will be described. FIG. 7 is a flowchart for explaining the operation of the substrate processing apparatus 101 according to an embodiment of the present invention.

Based on FIG. 7, explanation will be given for a method of applying heat treatment to the wafer 200, as one of the manufacturing steps of the semiconductor device. Note that in the explanation given hereafter, the operation of each part constituting the substrate processing apparatus 101 is controlled by the controller 280.

(S1)

First, a pod 110 is transferred to a placement table 122 as a pre-charge process. A wafer charging/discharging port 120 of the pod opener 121 is closed by a cap attaching and detaching mechanism 123, and clean air is flown to the transfer chamber 124 so that the transfer chamber 124 is filled with the clean air.

For example, by filling the transfer chamber 124 with nitrogen gas as the clean air, an oxygen concentration is set to 20 ppm or less, which is much lower than an oxygen concentration inside of the casing 111 (atmospheric state).

An opening side end face of the pod 110 placed on the placement table 122 is pressed against an opening edge portion of the wafer charging/discharging port 120 on a front side wall of the casing 111. A cap of the pod 110 is detached by the cap attaching and detaching mechanism 123, to open the wafer charging and discharging port.

When the pod 110 is opened by the pod opener 121, the wafer 200 is picked-up from the pod 110 by a tweezer 125c of the wafer transfer device 125a through the wafer charging and discharging port, then the wafer 200 is aligned by a notch aligner not shown, and thereafter is charged into the substrate holder 217.

(S10)

Specifically, in step S10, as shown in FIG. 5(A) to FIG. 5(D), FIG. 6(A), and FIG. 6(B), a plurality of wafers 200 are held by the substrate holder 217 in a state of being arranged approximately in the horizontal direction approximately in the vertical posture, and the wafers 200 are fixed by the fixing part (movable holding part 217c) in a state of being arranged approximately in the horizontal direction approximately in the vertical posture (S10). Specifically, by controlling the drive part (drive motor) 2178 by the controller 280, the movable holding part 217c is rotated with the rotation axis 2178c as a center, to thereby fix the wafer 200 by sandwiching it by the fixture holding part 2171a and the movable holding part 217c.

According to this embodiment, steps S11 to S13 shown in FIG. 7, FIG. 8(A) to FIG. 8(C) are executed as steps of fixing the plurality of wafers 200 in a state of being arranged in the horizontal posture in the vertical direction, by the fixing part of the substrate holder 217 in the step S10.

Figure 8:
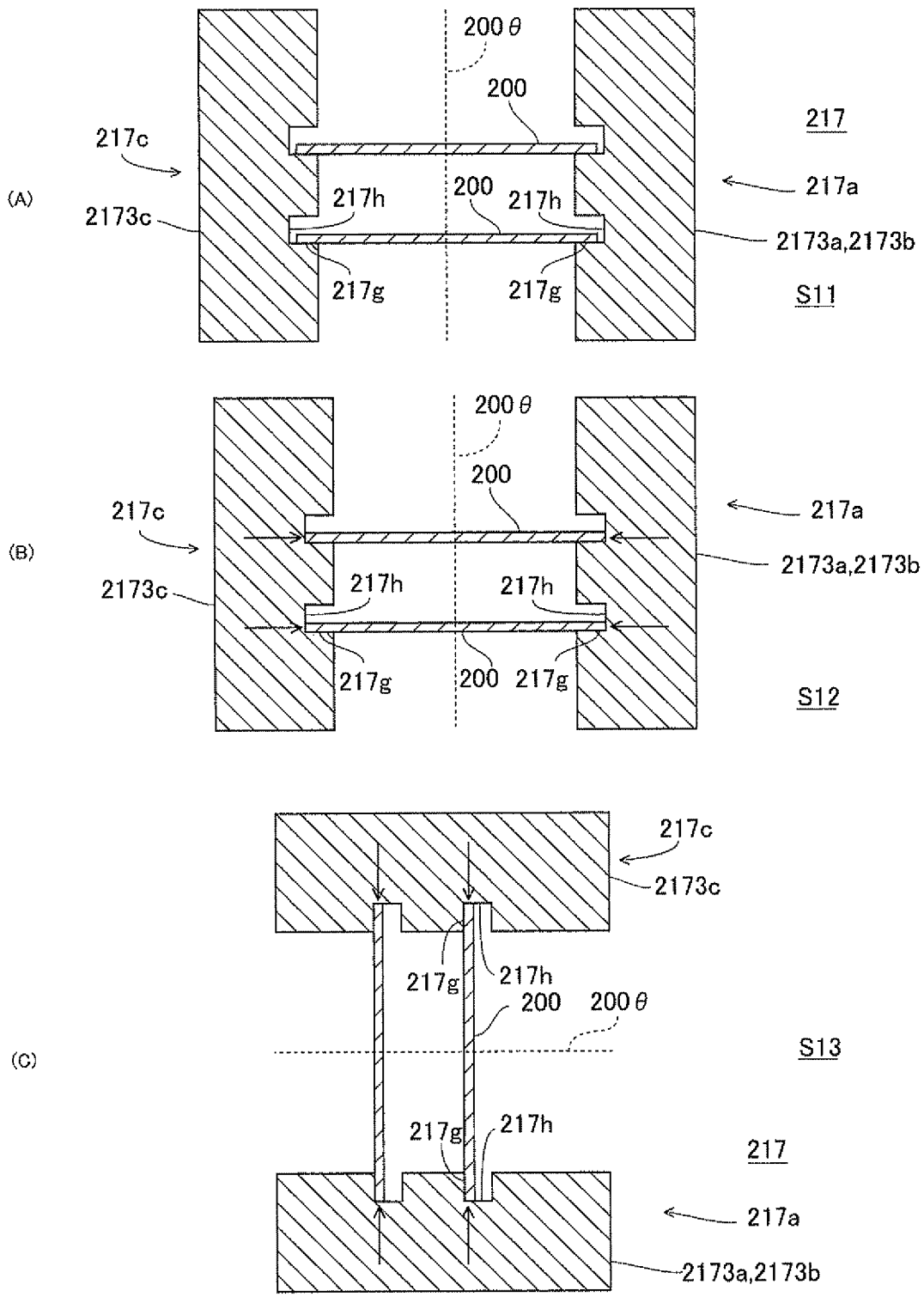
FIG. 8 (A) is a view for explaining a state that the substrate is held by the substrate holder in a horizontal posture, (B) is a view for explaining a state that the substrate is fixed by the substrate holder in a horizontal posture, and (C) is a view for explaining a state that the substrate is rotated by 90° while being fixed, and a posture of the substrate is converted to a vertical posture.

According to this embodiment, as shown in FIG. 8(A), a plurality of holding grooves 217h for holding the wafers 200 are formed on each strut (2173a, 2173b, 2173c) of the substrate holder 217. A groove width of the holding groove 217h (length along the longitudinal direction of the strut) of the holding groove 217h is formed wider than a thickness of the wafer 200.

(S11)

In step S11, as shown in FIG. 8(A), the substrate holder 217 is set in the vertical posture by the posture conversion/transfer mechanism 115, so that the axial direction of each strut 2173a to 2173c of the substrate holder 217 coincides with the vertical direction.

Subsequently, as shown in FIG. 8(A), the plurality of wafers 200 are held by the substrate holder 217 in a state of being arranged in the vertical direction in the horizontal posture. Specifically, the holding groove 217h of each strut 2173 (2173a to 2173c) has a side face (rising part) 217g, so that the wafer 200 inserted between the holding grooves 217h is set in the horizontal posture. By inserting the wafers 200 into the holding grooves 217h of the substrate holder 217 respectively, a direction orthogonal to the surface (main surface) of the wafer 200 and the longitudinal direction of each strut 2173 (the same direction as the direction of the rotation axis 200θ in this embodiment) agrees with each other.

(S12)

In step S12, as shown in FIG. 8(B), the plurality of wafers 200 are fixed in a state of being arranged in the vertical direction in the horizontal posture, by the fixing part (movable holding part 217c) of the substrate holder 217. The side face of the wafer 200 is sandwiched by the fixture holding part 217a of the substrate holder 217 and each strut 2173a, 2173b, 2173c of the movable holding part 217c.

(S13)

In step S13, as shown in FIG. 8(C), the posture of the substrate holder 217 is converted by rotating it by 90° around a horizontal axis by the posture conversion/transfer mechanism 115, so that the wafer 200 is set in the vertical posture, while fixing the plurality of wafers 200 by the fixing part (movable holding part 217c) of the substrate holder 217.

In the steps S11 to S13, the plurality of wafers 200 inserted into the holding grooves 217h of the struts is set in a state of being fixed by the fixing part (movable holding part 217c) of the substrate holder 217 in a state of being arranged approximately in the vertical posture along the horizontal direction.

(S20)

Subsequently, in step S20, by transferring the throat side sealing part 2190 by the posture conversion/transfer mechanism 115, the substrate holder 217 is charged (loaded) into the processing furnace 202 with wafers 200 fixed thereby, and the opening part 2021 of the processing tube 205 is air-tightly closed by the sealing part 2190.

At this time, both end portions of the substrate holder 217 along the rotation axial direction are rotatably supported by the rotation support part (rotation part 255 and the tail tube side rotation support part 2955) provided at both end portions of the processing tube 205 respectively.

(S30)

Subsequently, in step S30, prescribed substrate processing such as oxidation, diffusion, and annealing are applied to the wafer 200, by supplying the gas into the processing tube 205 while rotating the substrate holder 217 by the rotation part 255.

For example, by opening the open/close valve 243a, reactive gas or carrier gas is supplied to the gas supply part 2320 of the processing tube 205 from the gas supply unit 20 through the tail tube side gas supply port (introduction port) 2321a. Similarly, by opening the open/close valve 243b, the gas is supplied to the gas supply part 2320 of the processing tube 205 from the gas supply unit 20 through the throat side gas introduction port 2321b.

Then, by the vacuum pump 246a by opening the valve 242a, the gas is exhausted from the processing tube 205 through the gas exhaust line 231a. Similarly, by the vacuum pump 246b by opening the valve 242b, the gas is exhausted from the processing tube 205 through the gas exhaust line 231b. The pressure of the gas exhaust part 2310 in the processing tube 205 is lower than the pressure of the gas supply part 2320.

The gas flows toward the gas exhaust port 2041 of the inner tube 204 from the plurality of gas supply ports 2042 provided in the inner tube 204, through the processing chamber 201. At this time, the gas is supplied to the surface (main surface) of the wafer 200 in parallel thereto.

When the processing of the wafer is completed, inside of the processing tube is continued to be exhausted, and the supply of the processing gas into the processing tube 205 is stopped. At this time, atmosphere in the processing tube 205 is preferably replaced with inert gas by supplying the inert gas (such as nitrogen gas) into the processing tube 205.

Subsequently, the wafer 200 and the pod 110 are discharged to outside of the casing 111 in a procedure reverse to the aforementioned procedure.

As described above, the semiconductor device or the substrate according to an embodiment of the present invention is manufactured by executing the step S10 (S11, S12, S13), S20, and step S30.

(Effect of this Embodiment)

According to this embodiment, one or a plurality of effects shown below are exhibited.

(a) According to this embodiment, the substrate processing apparatus 101 comprises: the substrate holder 217 that holds a plurality of wafers 200 in a state of being arranged approximately in the horizontal direction approximately in the vertical posture; the processing tube 205 that houses the substrate holder 217; the throat side sealing part 2190 that air-tightly closes the opening part 2021 of the processing tube 205; and the rotation part 255 provided in the throat side sealing part 2190, for rotating the substrate holder 217, with an arrangement direction of the plurality of wafers 200 as the rotation axis. Then, the substrate holder 217 has the fixing part (movable holding part 217c) that fixes the substrate 200 approximately in the vertical posture.

Therefore, prescribed processing can be applied to the wafer 200 while rotating the wafer 200, with the rotation axis 200θ that agrees with the arrangement direction as a center, in a state that the plurality of wafers 200 are fixed by being arranged in the arrangement direction approximately in the vertical posture.

Namely, for example, when film formation processing is applied to the wafer 200, the thickness of a film formed on the wafer 200 can be made uniform.

Further, even when prescribed substrate processing is applied to the wafer 200 having relatively a large diameter, the substrate processing can be uniformly applied to the wafer 200 because deformation due to its own weight of the wafer 200 is relatively small. Further, thermal deformation due to heating added to the wafer 200 can also be suppressed.

(b) According to this embodiment, there are provided the gas supply part 2320 including having one or more gas supply ports, between an inner wall of the processing tube 205 and the wafers 200 held by the substrate holder 217, extending along the arrangement direction of the wafers 200, and a gas exhaust part 2310 including one or more gas exhaust ports 2041, at a position opposed to the gas supply ports 2042 through the wafer 200, extending along the arrangement direction of the wafers 200. Then, by flowing the gas (such as processing gas) toward the gas exhaust port 2041 from the gas supply port 2042, the gas is supplied to the surface (main surface) of the rotated wafer 200 in parallel thereto (side flow structure).

Therefore, the substrate processing can uniformly applied to the surface of the wafer 200.

Further, for example, when the processing of film formation is applied to the wafer 200, the thickness of the film formed on the wafer 200 can be uniformly set.

Further, convection flow of the gas in the processing tube 205 can be prevented.

(c) According to this embodiment, both or one of the plurality of gas supply ports 2042 and the plurality of gas exhaust ports 2041 have respectively a diameter for supplying the gas of approximately the same flow rate, to each of the plurality of wafers 200 held by the substrate holder 217.

Therefore, prescribed substrate processing can be uniformly applied to each of the plurality of wafers 200.

Further, even when the film formation processing is applied to each of the plurality of wafers 200 by for example an epitaxi growth technique, and CVD (chemical vapor deposition), etc., the thickness of the film formed on each of the plurality of wafers 200 can be uniformly set.

(d) According to this embodiment, the processing tube 205 includes an inner tube 204 that surrounds an outer periphery of the wafer 200 held by the substrate holder 217; an outer tube 203 that surrounds an outer periphery of the inner tube 204; partitioning plates 206 (206a, 206b) that partition a space between the inner tube 204 and the outer tube 203, into the gas supply part 2320 and the gas exhaust part 2310, extending along the arrangement direction of the plurality of wafers 200. The inner tube 204 includes the gas supply port 2042 that communicates the inside of the gas supply part 2320 and the inside of the inner tube 204; and the gas exhaust port 2041 that communicates the inside of the gas exhaust part 2310 and the inside of the inner tube 204.

Therefore, functions of the gas supply part 2320 and the gas exhaust part 2310 can be realized, with relatively a simple structure of the inner tube 204, the outer tube 203, and the partitioning plate 206.

(e) According to this embodiment, the gas supply line (gas introduction tube) 232b that supplies gas into the gas supply part 2320, and the gas exhaust line 231b that exhausts the inside of the gas exhaust part 2310, are provided in the seal flange 219 of the throat side sealing part (sealing part) 2190.

Therefore, gas can be supplied into the processing chamber 201 of the gas supply part 2320 in the processing tube 205 from the gas supply line (gas introduction tube) 232b, and the inside of the gas exhaust part 2310 can be exhausted from the gas exhaust line 231b in a state of air-tightly closing the opening part of the processing tube 205, by the seal flange 219 of the throat side sealing part (sealing part) 2190.

(f) According to this embodiment, the gas supply port 2321a that communicates with the gas supply part 2320 of the processing tube 205, and the gas exhaust port 2311a that communicates with the gas exhaust part 2310 of the processing tube 205, are provided in the tail tube side seal flange 2919 of the tail tube side sealing part 2900.

Therefore, from the tail tube side as well, the gas can be supplied into the processing chamber 201 of the gas supply part 2320 in the processing tube 205 from the gas supply line (gas introduction tube) 232a, and the inside of the gas exhaust part 2310 can be exhausted from the gas exhaust line 231a.

(g) According to this embodiment, the gas is supplied and exhausted from the throat side and the tail tube side.

Therefore, the gas can be supplied and exhausted with relatively high efficiency, compared with a case that the gas is supplied and exhausted from one side (throat side or the tail tube side).

(h) According to this embodiment, both end portions of the substrate holder 217 along the rotation axial direction, are rotatably supported by the rotation support part (rotation part 255 and the rotation support part 2955) provided at both end portions of the processing tube 205 respectively.

Therefore, the substrate holder 217 can be rotated with relatively high stability with the rotation axis 200θ as a center, for example compared with a case that only one of the both end portions of the substrate holder 217 along the rotation axial direction is rotatably supported.

(i) According to this embodiment, the substrate holder 217 includes a plurality of struts (2173a, 2173b, 2173c) for sandwiching the side face of the wafer 200. Specifically, the substrate holder 217 includes the fixture holding part 217a (struts 2173a, 2173b) that supports the side face of the wafer 200; and the movable holding part 217c (strut 2173c) that can be displaced between a state that the wafers 200 held by the fixture holding part 217a are fixed by holding other portion of the side faces of the wafers 200, and a state that the substrate can be removed.

Therefore, the wafer 200 can be easily fixed in a state of being arranged approximately in the vertical posture approximately in the horizontal direction, by each strut (2173a, 2173b, 2173c) of the fixture holding part 217a and the movable holding part 217c.

(j) According to this embodiment, the processing tube 205 (inner tube 204), the wafers 200 arranged in the processing tube 205 (inner tube 204), and the heater 207 provided to surround the processing tube 205, are arranged respectively concentrically.

Further, the rotation axis 200θ of the rotation part 255 agrees with centers of the wafer 200, the heater 207, and the processing tube 205. Specifically, the wafer 200 fixed to the substrate holder 217 is rotated, with the rotation axis 200θ passing through the center of the wafer 200 in the arrangement direction of the wafer 200 as a center.

Then, the gas supply port 2042 is arranged at one side of the wafer 200, and the gas exhaust port 2041 is arranged at a position opposed to the gas supply port 2042 through the wafer 200, so that the gas is supplied to the surface (main surface) of the wafer 200 in parallel thereto.

Therefore, substrate processing can be applied to the wafer 200 with relatively small thermal deviation in the surface of the wafer, compared with a case that the centers of the processing tube 205 (inner tube 204), the wafer 200, and the heater 207 are deviated from each other.

Namely, when film formation processing is applied to the wafer 200, the film can be uniformly formed in the surface of the wafer.

(k) According to this embodiment, the semiconductor device is manufactured by executing the steps of:

(S10) fixing a plurality of wafers 200 in a state of being arranged approximately in the horizontal direction approximately in the vertical posture, by the fixing part (movable holding part 217c) provided in the substrate holder 217;

(S20) housing the substrate holder 217 in the processing tube 205, with the wafer 200 fixed thereby, and air-tightly closing the opening part 2021 of the processing tube 205 by the throat side sealing part 2190; and (S30) applying processing to the wafer 200 by supplying gas into the processing tube 205, while rotating the substrate holder 217 by the rotation part 255.

Therefore, for example, even when substrate processing is applied to the wafer 200 having relatively a large diameter, substrate processing can be uniformly and relatively easily applied to the surface of the wafer.

(1) According to this embodiment, in the step (S10) of fixing the plurality of wafers 200 approximately in the vertical posture by the fixing part (movable holding part 217c) of the substrate holder 217, the steps of:

(S11) holding the plurality of wafers 200 in the horizontal posture in the vertical direction, by the substrate holder 217;

(S12) fixing the plurality of wafers 200 in a state of being arranged in the horizontal posture in the vertical direction, by the fixing part (movable holding part 217c) of the substrate holder 217;

(S13) converting the posture of the substrate holder so that the plurality of wafers 200 are set approximately in the vertical posture while fixing the wafers by the fixing part (movable holding part 217c) of the substrate holder 217, are executed by the substrate processing apparatus 101.

Therefore, the plurality of wafers 200 can be relatively easily fixed to the substrate holder 217 in a state of being arranged approximately in the horizontal direction approximately in the vertical posture.

FIRST COMPARATIVE EXAMPLE

Vertical Processing Furnace

Figure 9:
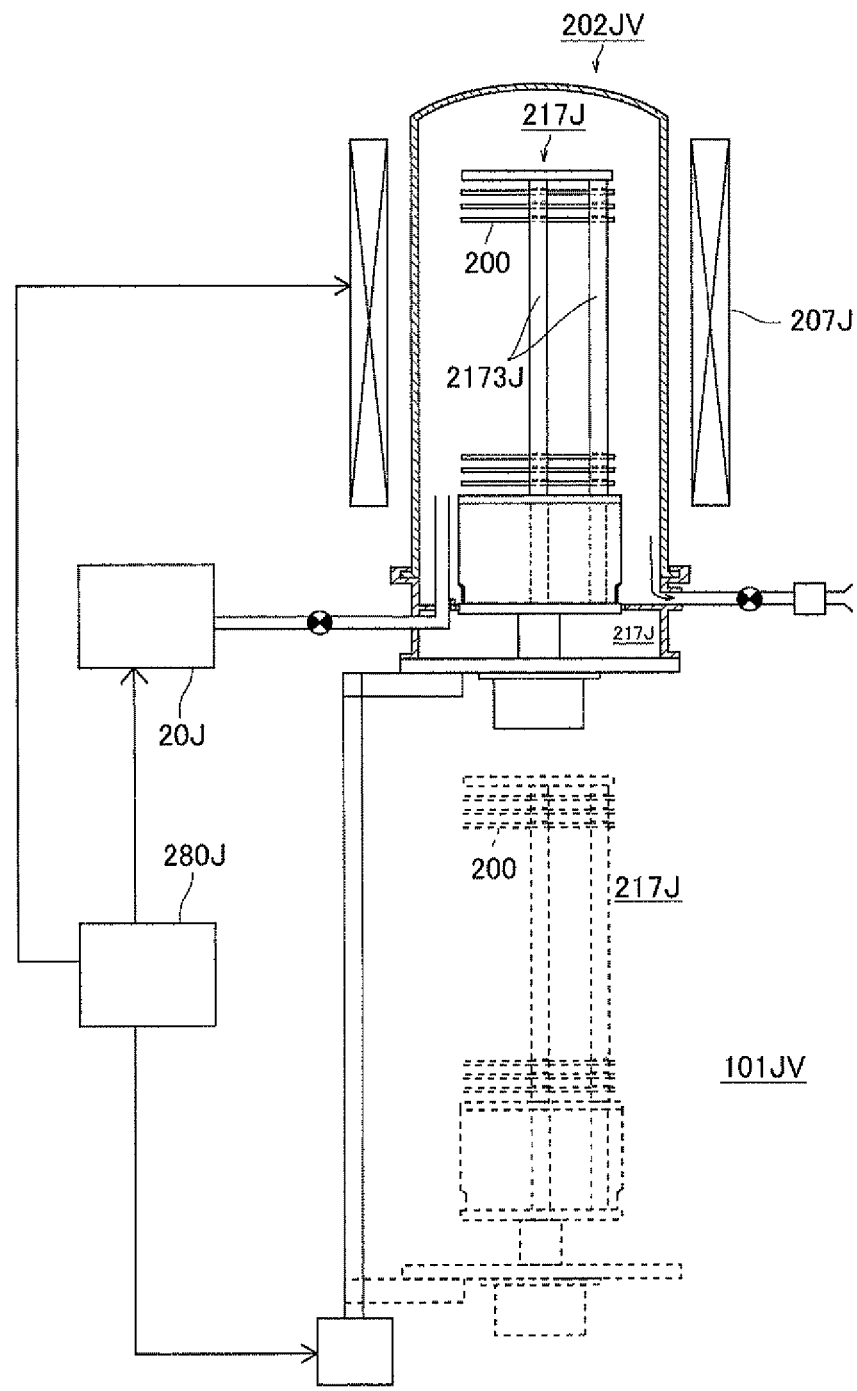
FIG. 9 is a view for explaining the substrate processing apparatus including a vertical processing furnace according to a comparative example.
Figure 10:
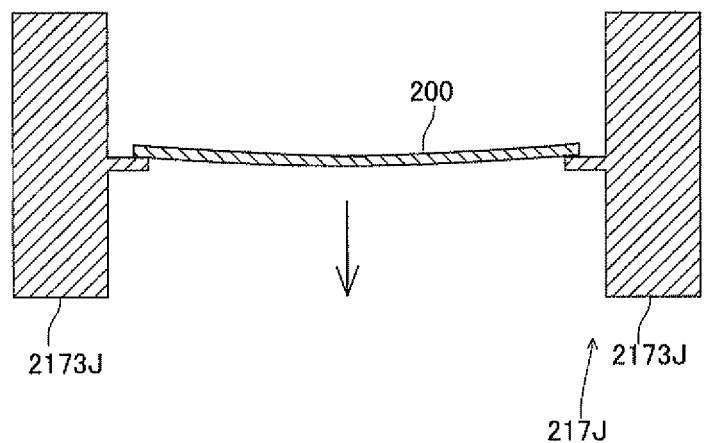
FIG. 10 is a view for explaining a wafer supported in a horizontal posture by the substrate holder of the substrate processing apparatus according to the comparative example shown in FIG. 9.

FIG. 9 is a view for explaining a substrate processing apparatus 101JV including a vertical processing furnace according to a comparative example. FIG. 10 is a view for explaining the wafer 200 supported in the horizontal posture, by the substrate holder 217J of the substrate processing apparatus 101JV according to a comparative example.

For example, as shown in FIG. 9 and FIG. 10, in the substrate processing apparatus 101JV including the vertical processing furnace according to the comparative example, the outer peripheral part of the wafer 200 is supported in the horizontal posture, by a plurality of struts 2173J of the substrate holder 217J.

Namely, in the substrate processing apparatus 101JV, as shown in FIG. 10, prescribed substrate processing is applied in the processing furnace, to the wafer 200 in a state of being deformed by its own weight. Therefore, for example, problems occur, such as generating strain in the wafer 200 due to heating by the heater 207J; generating non-uniform temperature distribution in the surface of the wafer during substrate processing; and generating slip (dislocation) in the wafer 200.

SECOND COMPARATIVE EXAMPLE

Lateral Processing Furnace

Figure 11:
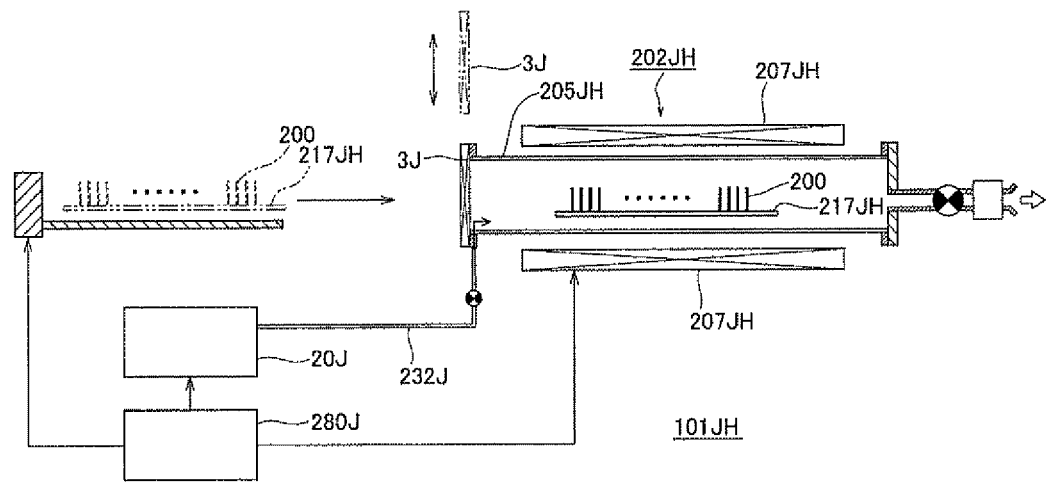
FIG. 11 is a conceptual view of the substrate processing apparatus including a lateral processing tube according to a comparative example.
Figure 12:
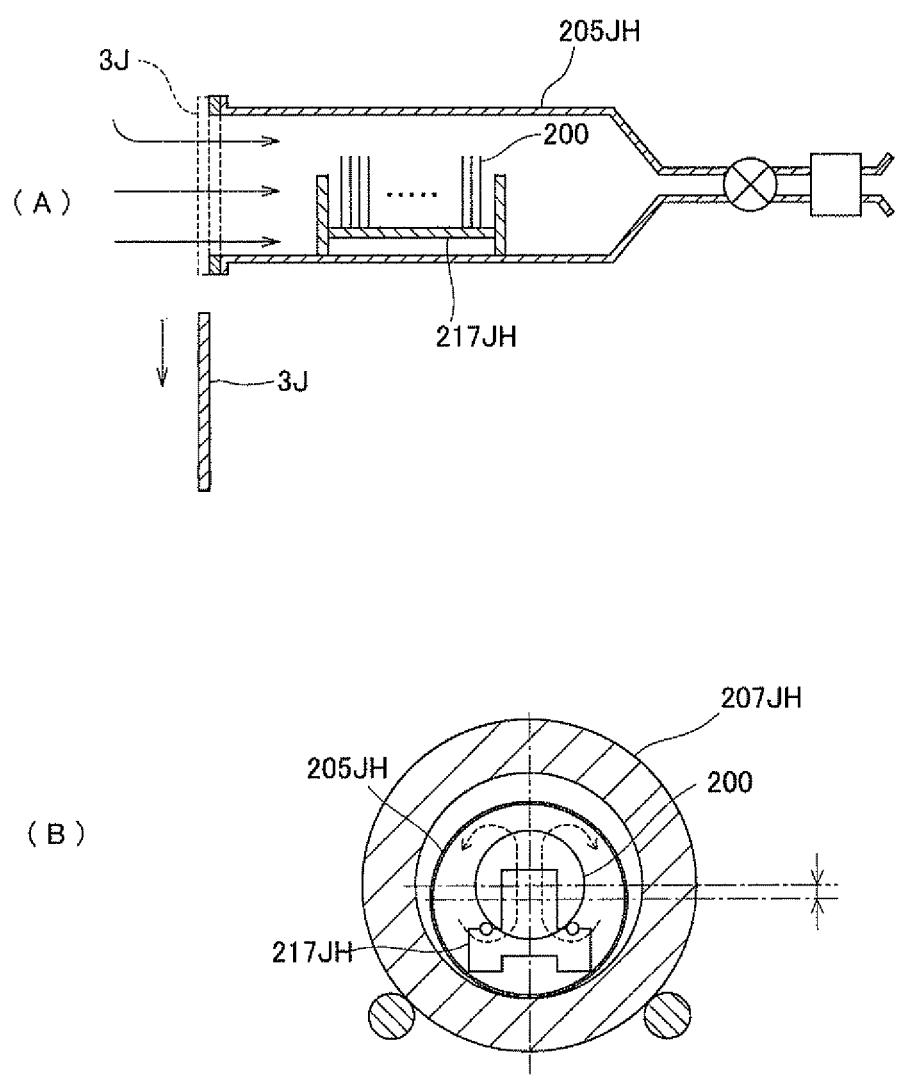
FIG. 12 is a view for explaining the substrate processing apparatus shown in FIG. 11, and (B) is a view for explaining a convection flow generated in the processing tube, when a center of a wafer, a center of the processing tube, and a center of a heater don't agree with one another in the substrate processing apparatus shown in FIG. 11.

FIG. 11 is a conceptual view of the substrate processing apparatus 101JH including a lateral processing furnace 202JH according to a comparative example. FIG. 12(A) is a view for explaining the substrate processing apparatus 101JH shown in FIG. 11, FIG. 12(B) is a view for explaining the convection flow generated in the processing tube 205JH, when the center of the wafer 200, the center of the processing tube, and the center of the heater don't agree with one another.

As shown in FIG. 12(A), when a throat shutter 3J is opened/closed in a state that the plurality of wafers 200 are held on a quartz boat 217JH in the vertical posture in a laterally-long processing tube 205JH, entangling of the atmosphere occurs near the throat shutter 3J, thus not allowing an oxygen concentration in the processing tube 205JH to be reduced, and causing a natural oxide film to be formed on the wafer in some cases.

Further, as shown in FIG. 12(B), in a substrate processing apparatus 101k according to a comparative example, when the center of a heating heater 2073 and the center of the processing tube 205JH don't agree with each other, convection flow occurs in the gas in the processing tube 205JH due to the heat from the heater 207J, and therefore the thickness of the film formed on the wafer 200 is not uniform in the surface of the wafer in some cases.

<Second Embodiment of the Present Invention☐

Figure 13:
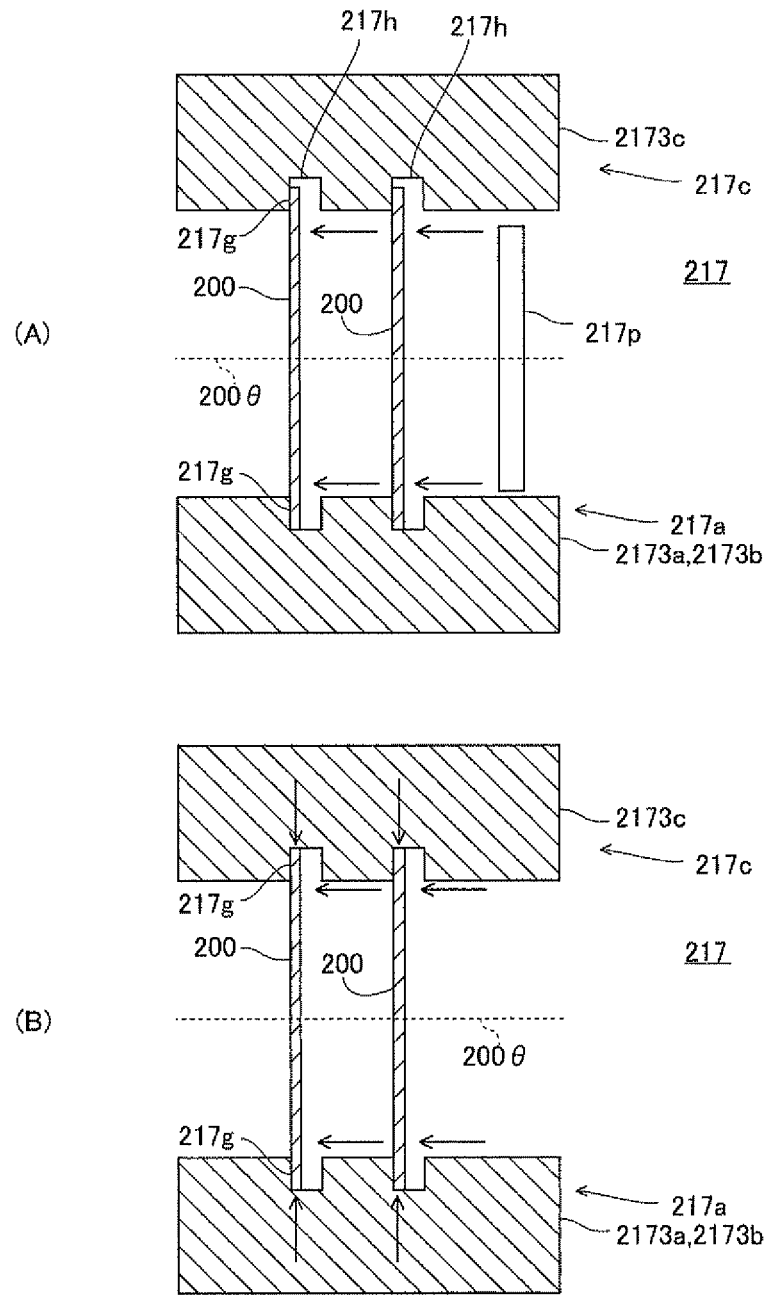
FIG. 13(A) is a view for explaining an operation of the substrate holder of the substrate processing apparatus according to a second embodiment of the present invention, and (B) is a view for explaining an operation of fixing a wafer by the substrate holder shown in (A).

FIG. 13(A) is a view for explaining the operation of the substrate holder 217 of the substrate processing apparatus according to a second embodiment of the present invention. FIG. 13(B) is a view for explaining the operation of fixing the wafer 200 by the substrate holder 217 shown in FIG. 13(A).

The second embodiment of the present invention will be described hereafter, with reference to the drawings.

According to this embodiment, as shown in FIG. 13(A) and FIG. 13(B), widths of the holding grooves 217h of the struts 2173a, 2173b, 2173c of the substrate holder 217 along the longitudinal direction of the struts are formed wider than the thickness of the wafer 200.

First, as shown in FIG. 13(A), the wafer 200 is held in the vertical posture by the struts 2173a, 2173b, 2173c of the substrate holder 217.

Then, pressurizing is added to the wafer 200 held in the vertical posture, toward one of the side faces (rising parts) 217g of the holding grooves 217h, along the longitudinal direction of each strut, by a position correcting means 217p.

The position correcting means 217p may be a mechanical structure, or may be a pressure, etc., of the gas ejected from the gas supply port.

Subsequently, as shown in FIG. 13(B), in a pressurized state, the side face of the wafer 200 in the vertical posture is sandwiched by the struts 2173a, 2173b of the fixture holding part 217a of the substrate holder 217, and the strut 2173c of the movable holding part, to thereby fix the wafer 200 to the substrate holder 217 approximately in the vertical posture.

(Effect of this Embodiment)

According to this embodiment, the side face of the wafer 200 is sandwiched by the struts 2173a to 2173c of the substrate holder 217, in a state of pressurization added to the wafer 200 held in the vertical posture, toward one of the side faces (rising parts) 217g of the holding grooves 217h, along the longitudinal direction of the struts, by the position correcting means 217p.

Therefore, a plurality of wafers 200 can be relatively easily fixed to the substrate holder 217 in a state of being arranged in the horizontal direction in the vertical posture.

Further, the plurality of wafers 200 can be relatively easily positioned and fixed to a prescribed position of the substrate holder 217.

<Third Embodiment of the Present Invention>

Figure 14:
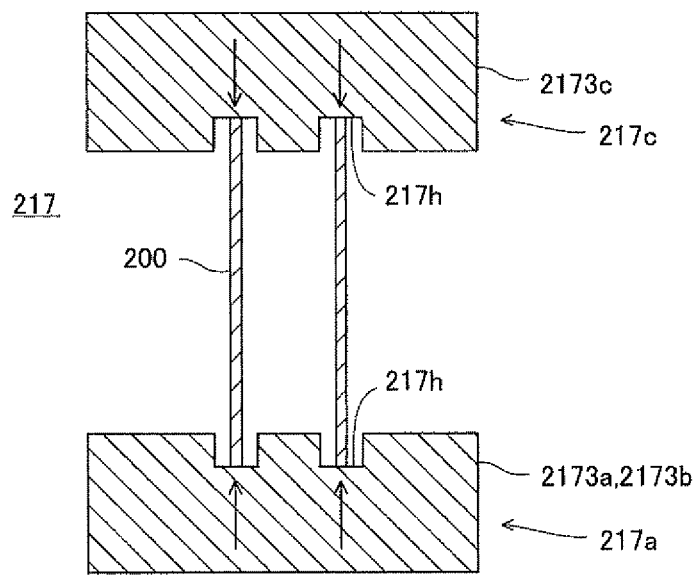
FIG. 14 is a view for explaining the substrate holder of the substrate processing apparatus according to a third embodiment of the present invention.

FIG. 14 is a view for explaining the substrate holder 217 of the substrate processing apparatus according to a third embodiment of the present invention. The third embodiment of the present invention will be described hereafter, with reference to the drawings. Explanation for the structure similar to the structures of the first and second embodiments is omitted.

According to this embodiment, as shown in FIG. 14, the side face of the wafer 200 is sandwiched by flat parts of the holding grooves 217h of each of the struts 2173a, 2173b, and 2173c of the substrate holder 217, in a state that the plurality of wafers 200 are set in a state of being arranged in the horizontal direction in the vertical posture. At this time, the wafer 200 is preferably sandwiched by approximately center portions of the flat parts of the holding grooves 217h of each of the struts 2173a, 2173b, 2173c.

(Effect of this Embodiment)

According to this embodiment, the side face of the wafer 200 is sandwiched by the center portions of the flat parts of the holding grooves 217h of each of the struts 2173a, 2173b, and 2173c of the substrate holder 217. Therefore, gas (such as reactive gas) is supplied to the vicinity of the outer peripheral part of the wafer 200.

Namely, prescribed substrate processing is uniformly applied to the surface of the wafer, extending from the center part to the outer peripheral part of the wafer 200.

<Fourth Embodiment of the Present Invention>

Figure 15:
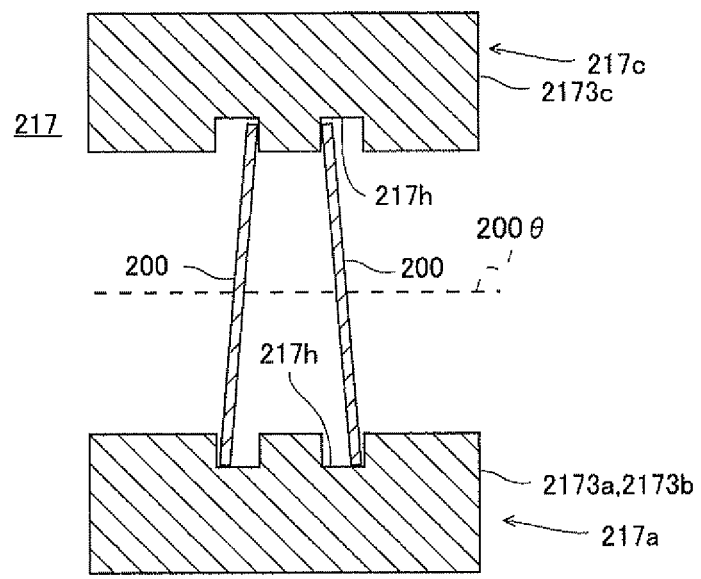
FIG. 15 is a view for explaining the substrate holder of the substrate processing apparatus according to a fourth embodiment of the present invention.

FIG. 15 is a view for explaining the substrate holder 217 of the substrate processing apparatus according to a fourth embodiment of the present invention. The fourth embodiment of the present invention will be described hereafter, with reference to the drawings. Explanation for the structure similar to the structures of the first to third embodiments is omitted.

In the first to third embodiments, the wafer 200 is fixed to the substrate holder 217 in the vertical posture. However, the present invention is not limited to these embodiments.

In this embodiment, for example, as shown in FIG. 15, the wafer 200 is held by the substrate holder 217 approximately in the vertical posture, in a state that the wafer 200 is inserted into the holding grooves 217h of the struts 2173a, 2173b, 2173c respectively. At this time, the wafer 200 may be set in a state of being inclined by a portion of a groove width of the holding groove 217h. The substrate holder 217 is rotated with the rotation axis 200θ as a center, during substrate processing.

(Effect of this Embodiment)

According to this embodiment, the wafer 200 is held approximately in the vertical posture, by the substrate holder 217 in a state that the wafer 200 is inserted into the holding grooves 127h of the struts 2173a, 2173b, 2173c of the substrate holder 217.

Therefore, in this embodiment, the wafers 200 can be relatively easily held in a state of being arranged approximately in the horizontal direction approximately in the vertical posture, by the substrate holder 217, compared with the first to third embodiments.

<Fifth Embodiment of the Present Invention>

Figure 16:
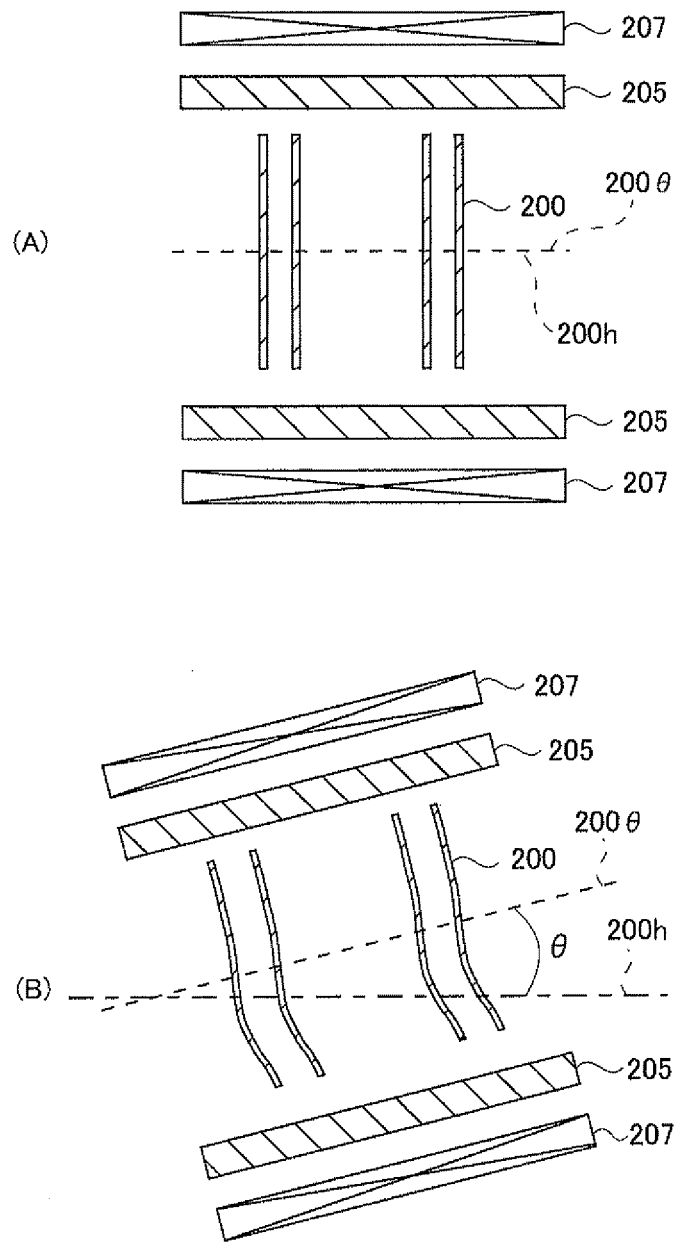
FIG. 16 (A) is a view for explaining the operation of the substrate processing apparatus according to a fifth embodiment of the present invention (in a case that an axial direction (longitudinal direction) and a horizontal direction of a rotation axis coincide with each other), (B) is a view for explaining the operation of the substrate processing apparatus according to a fifth embodiment of the present invention (the axial direction (longitudinal direction) of the rotation axis is inclined by angle θ with respect to the horizontal direction).

FIG. 16(A) is a view for explaining the operation of the substrate processing apparatus according to a fifth embodiment of the present invention (a case that the axial direction (longitudinal direction) of the rotation axis 200θ and the horizontal direction 200h coincide with each other). FIG. 16(B) is a view for explaining the operation of the substrate processing apparatus according to a fifth embodiment of the present invention (a case that the axial direction (longitudinal direction) of the rotation axis 200θ is inclined by angle θ from the horizontal direction 200h). FIG. 16(C) is a view for explaining the wafer 200 in a state of being deformed by its own weight. Note that in FIG. 16(A) and FIG. 16(B), the substrate holder, etc., is not shown. Explanation for the structure similar to the structures of the first to fourth embodiments is omitted.

As shown in FIG. 16(A) and FIG. 16(B), the substrate processing apparatus according to this embodiment is formed so that an angle formed by the rotation axis 200θ and the horizontal direction 200h is set to not more than a prescribed angle, with the arrangement direction of the plurality of wafers 200 as the rotation axis 200θ, when the substrate holder 217 is rotated by the rotation part 255.

As shown in FIG. 16(C), the wafer 200 is deformed by its own weight in a state of being inclined from the vertical posture, thus generating a stress inside of the wafer. In this embodiment, the angle formed by the rotation axis 200θ and the horizontal direction 200h is set to angle θ at which the stress added to the wafer 200 is suppressed to not more than a prescribed stress.

Specifically, the angle formed by the rotation axis 200θ and the horizontal direction 200h is preferably set to angle θ not allowing the slip (dislocation) to be generated by the stress added to the wafer 200.

For example, angle θ formed by the rotation axis 200θ and the horizontal direction 200h is set within a range from 0° to 30°.

(Effect of this Embodiment)

According to this embodiment, when the substrate holder 217 is rotated by the rotation part 255, the angle formed by the rotation axis 200θ and the horizontal direction 200h is set to angle θ of suppressing the stress added to the wafer 200 to not more than a prescribed stress, and specifically the angle formed by the rotation axis 200θ and the horizontal direction 200h is set to angle θ not allowing the slip (dislocation) to be generated in the wafer 200 due to the stress added to the wafer 200.

Therefore, as shown in FIG. 16(B), when prescribed substrate processing is applied to the wafer 200, while rotating the wafer 200 in a state of being inclined, reduction of the slip (dislocation) generated in the wafer 200 can be reduced even when an internal stress is generated by inclination of the wafer 200.

<Sixth Embodiment of the Present Invention>

Figure 17:
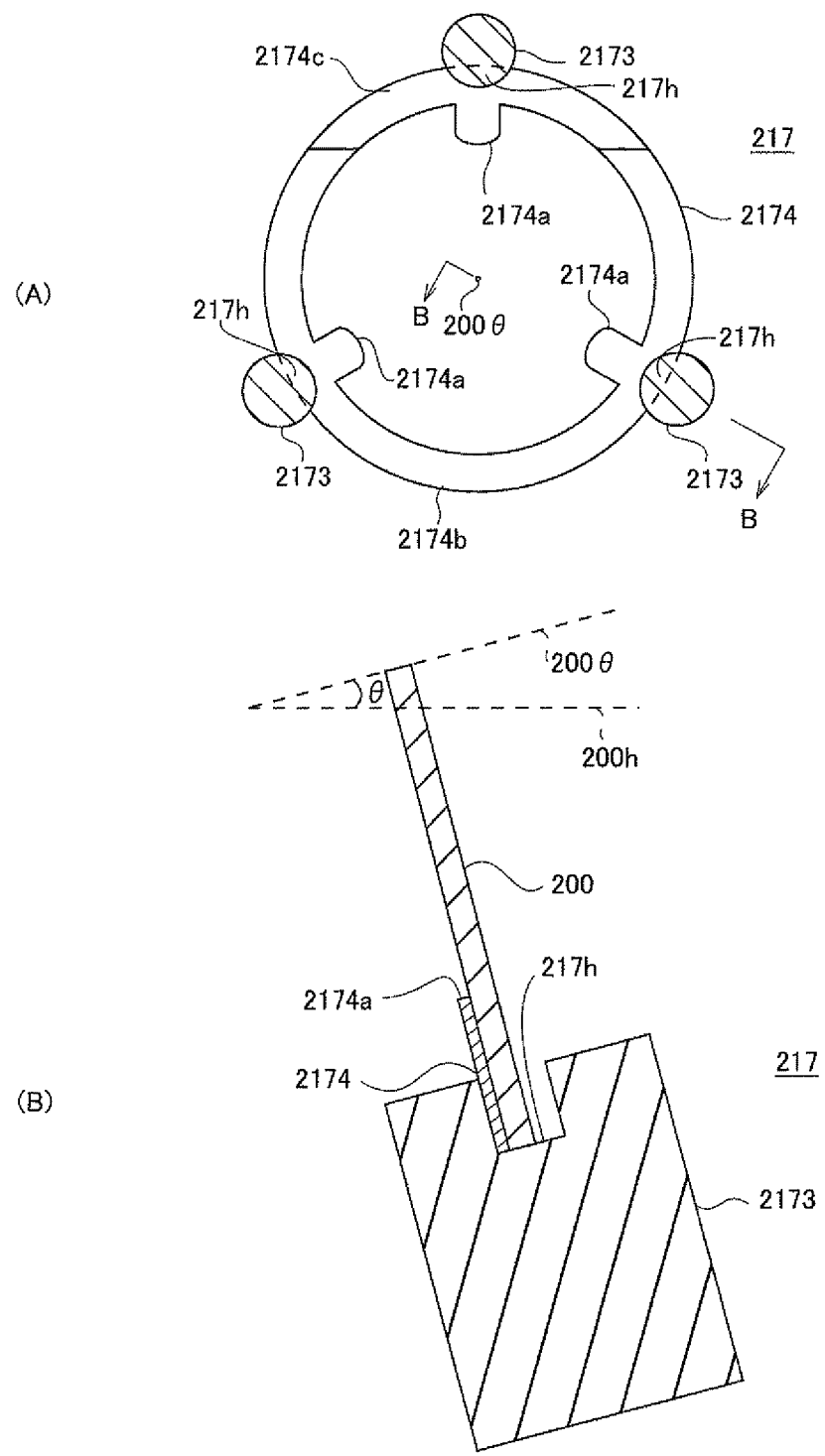
FIG. 17 (A) is a front view of the substrate holder of and a ring-like member (ring boat) of the substrate processing apparatus according to a sixth embodiment of the present invention, and (B) is an expanded sectional view of a strut of the substrate holder of the substrate processing apparatus and a ring boat and a wafer.

FIG. 17(A) is a front view of the substrate holder 217 and a ring-shaped member (ring boat) 2174 of the substrate processing apparatus according to a sixth embodiment of the present invention. FIG. 17(B) is an expanded sectional view of the strut 2173, the ring boat 2174, and the wafer 200 of the substrate holder 217 of the substrate processing apparatus shown in FIG. 17(A). Explanation for the structure similar to the structures of the first to fifth embodiments is omitted.

As shown in FIG. 17(A) and FIG. 17(B), according to this embodiment, the ring-shaped member (ring boat) 2174 is provided to each holding groove 217h of the substrate holder 217.

The ring boat 2174 is made of a non-metal material having heat resistance such as quartz ($SiO_2$) or silicon carbide (SiC). A part of the outer peripheral part of the ring boat 2174 is arranged in the holding groove 217h of the strut 2173.

For example, a protrusion 2174a protruded toward radially inside is formed on the ring boat 2174 according to this embodiment. The protrusion 2174a is formed at a position corresponding to a part in contact with the ring boat 2174 and the strut 2173.

As shown in FIG. 17(A), the strut 2174 of the substrate holder 217 may also be formed at approximately equal intervals along a peripheral direction with the center axis 200θ as a reference. The strut 2174 is preferably arranged to support the wafer 200 during rotation of the substrate holder 217.

As shown in FIG. 17(A), the ring boat 2174 also has the fixture holding part 2174b and the movable holding part 2174c. Namely, the wafer 200 is held by the ring boat 2174 in a state that the movable holding part 2174c is opened. Then, the wafer 200 is positioned on the ring boat 2174 by the movable holding part 2174c. Then, in this embodiment, the substrate holder 217 is rotated in the peripheral direction with the rotation axis 200θ as a center, in a state that the rotation axis 200θ of the substrate holder 217 is inclined by angle θ from the horizontal direction.

As shown in FIG. 17(B), in this embodiment, the rotation axis 200θ of the substrate holder 217 holding the wafer 200 is inclined by angle θ from the horizontal direction 200h. The wafer 200 is arranged on the ring boat 2174 of the holding groove 217h.

(Effect of this Embodiment)

According to this embodiment, the ring boat 2174 is provided to the substrate holder 217.

Therefore, even if the rotation axis 200θ of the substrate holder 217 is rotated in a state of being inclined from the horizontal direction 200h, the outer peripheral part of the wafer 200 is held by the ring boat 2174, and the deformation of the wafer 200 by its own weight can be reduced. Further, the protrusion 2174a is formed on an inner peripheral part of the ring boat 2174. Therefore, the vicinity of the outer peripheral part of the wafer 200 can be widely supported by the protrusion 2174a, and the deformation of the wafer 200 by its own weight can be further reduced.

Namely, the generation of the slip (dislocation) in the wafer 200 can be reduced.

Note that according to this embodiment, as shown in FIG. 17(A), the ring boat 2174 can be divided into the fixture holding part 2174b and the movable holding part 2174c. However, the present invention is not limited to this embodiment. For example, any one of the plurality of struts 2173 may be formed movable. With this structure, the rotation drive part (corresponding to the drive part 2178) for driving the movable holding part 2174c can be eliminated. Further, with this structure, manufacture of the ring boat 2174 is simple with few movable parts, thus achieving a low cost.

<Seventh Embodiment of the Present Invention>

Figure 18:
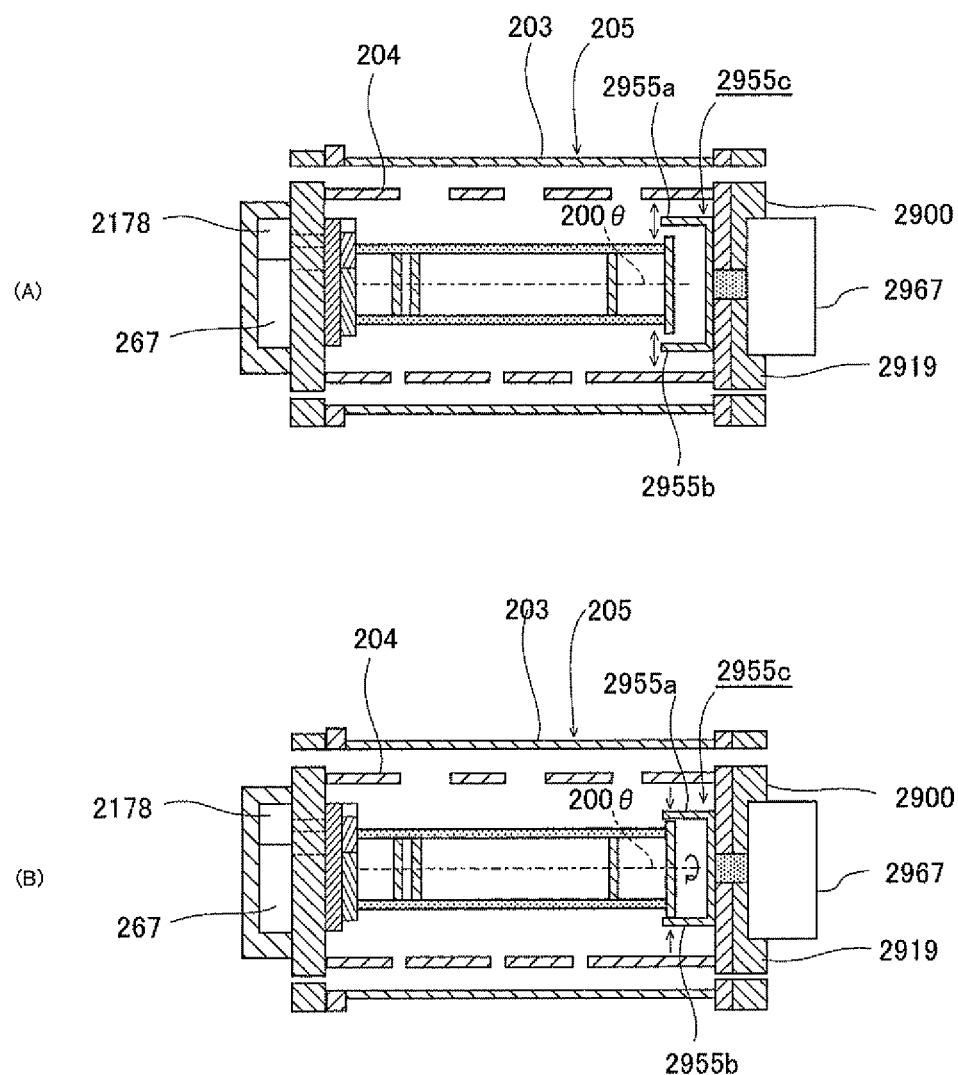
FIG. 18 (A) is a view for explaining a rotation support part (tail tube side rotation support part) of the substrate processing apparatus according to a seventh embodiment of the present invention, and (B) is a view for explaining a state that both end portions of the substrate holder are rotatably supported by the tail tube side rotation support part.

FIG. 18(A) is a view for explaining the tail tube side rotation support part 2955c of the substrate processing apparatus according to a seventh embodiment of the present invention. FIG. 18(B) is a view for explaining a state that both end portions of the substrate holder 217 are rotatably supported by the tail tube side rotation support part 2955c. The seventh embodiment of the present invention will be described hereafter, with reference to the drawings. Explanation for the structure similar to the structures of the first to sixth embodiments is omitted.

As shown in FIG. 18(A) and FIG. 18(B), the tail tube side rotation support part 2955c according to this embodiment includes a pair of holding arms 2955a, 2955b movably provided in a direction orthogonal to the rotation axis 200θ. The interval of the holding arms 2955a and 2955b is adjusted by a drive mechanism not shown. The drive mechanism is controlled by the controller 280.

The operation of the tail tube side rotation support part 2955c with this structure will be described.

When the wafer 200 and the substrate holder 217 are housed in the processing tube 205, as shown in FIG. 18(A) and FIG. 18(B), the tail tube side rotation support part 2955 rotatably holds the end portions of the substrate holder 217 by sandwiching the outer peripheral part of the endplates 2172a, 2172c of the substrate holder 217, by the holding arms 2955a and 2955b.

When substrate processing is ended, the holding arms 2955a, 2955b are adjusted to be separated from each other.

(Effect of this Embodiment)

According to this embodiment, the tail tube side rotation support part 2955 includes the holding arms 2955a and 2955b.

Therefore, the end portions of the substrate holder 217 can be simply rotatably held by sandwiching the outer peripheral part of the end plates 2172a, 2172c of the substrate holder 217, by the holding arms 2955a and 2955b.

Further, even when a plurality of (for example, fifty) wafers 200 having a large diameter are held by the substrate holder 217, the substrate holder 217 can be satisfactorily rotated without deviating its end portions from the center of rotation by its own weight, thus making it possible to perform substrate processing satisfactorily.

<Eighth Embodiment of the Present Invention>

Figure 19:
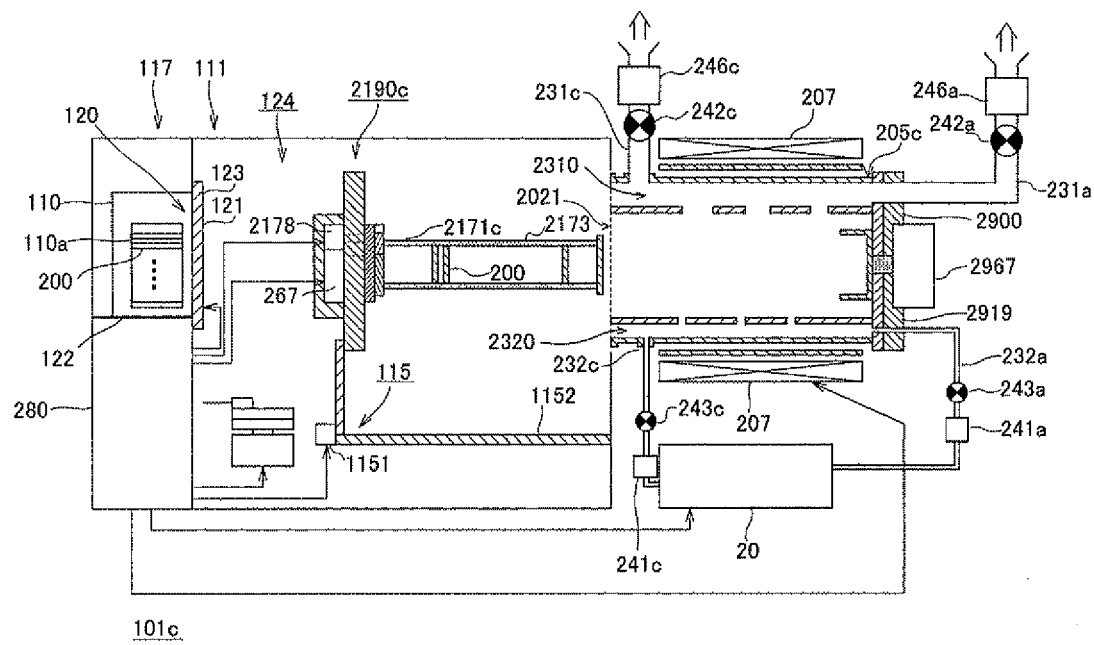
FIG. 19 is a schematic block diagram of the substrate processing apparatus according to an eighth embodiment of the present invention.
Figure 20:
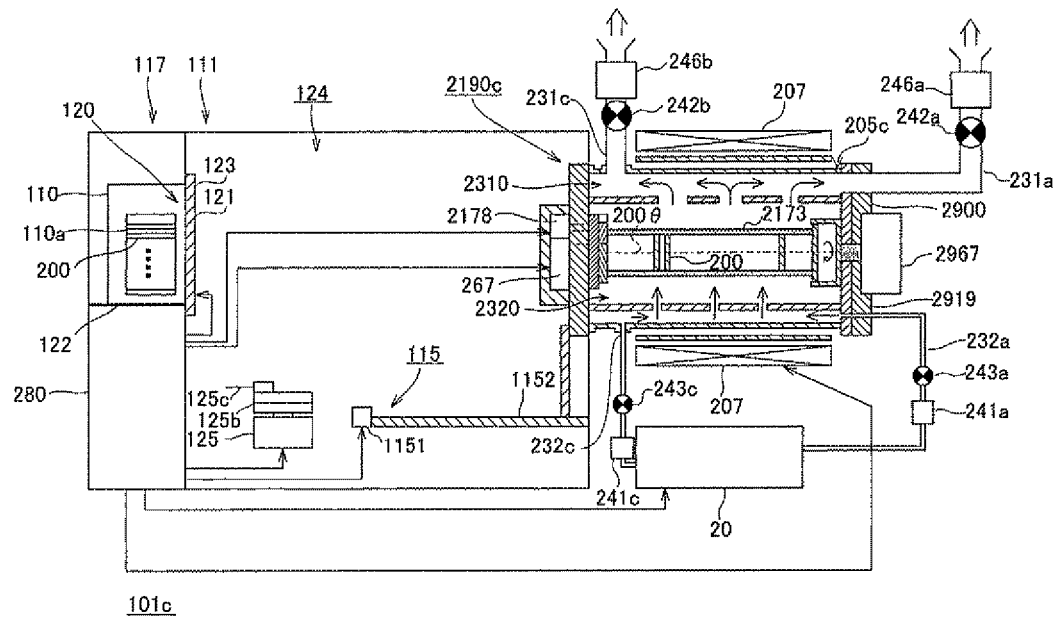
FIG. 20 is a view for explaining the substrate processing apparatus in a state that the processing tube shown in FIG. 19 is air-tightly closed.

FIG. 19 is a schematic block diagram of a substrate processing apparatus 101c according to an eighth embodiment of the present invention. FIG. 20 is a view for explaining the substrate processing apparatus 101c in a state that a throat (opening part) 2021 of a processing tube 205c shown in FIG. 19 is air-tightly closed. The eighth embodiment of the present invention will be described hereafter, with reference to the drawings. Explanation for the structure similar to the structures of the first to seventh embodiments is omitted.

A gas supply tube 232c and a gas exhaust tube 231c are provided to the processing tube 205c of this embodiment in the vicinity of the throat side end portions.

An upper stream side of the gas supply tube 232c is connected to the gas supply unit 20. An LMFD 241c and an open/close valve 243c are provided to the gas supply tube 232c from the upper stream side. Gas is supplied to the gas supply part 2320 of the processing tube 205 from the gas supply unit 20 by opening the open/close valve 243c.

The gas exhaust tube 231c is connected to a vacuum pump 245c through a valve 242c.

The operation of the substrate processing apparatus 101c with this structure will be described.

For example, the wafer 200 is transferred to the substrate holder 217 along a sequence shown in FIG. 7, and the substrate holder 217 is transferred to the processing furnace 202.

Gas is supplied to the gas supply part 2320 of the processing tube 205 from the gas supply unit 20 through gas supply tubes 232c, 232a.

Further, the gas is exhausted from the gas exhaust part 2310 of the processing tube 205c through the gas exhaust tube 231c, the valve 242c, and the vacuum pump 246c.

(Effect of this Embodiment)

According to this embodiment, the gas supply tube 232c and the gas exhaust tube 231c are provided in the vicinity of the throat side end portions of the processing tube 205c.

Therefore, the throat side sealing part 2190 can be transferred without transferring a gas supply system and a gas exhaust system, compared with the first embodiment. Accordingly, a trouble such as a contact with the gas supply system and the gas exhaust system can be prevented, when the posture of the substrate holder 217 is converted or the substrate holder 217 is transferred by the posture conversion/transfer mechanism 115.

Further, according to this embodiment, a mechanism of transferring the gas supply system and the gas exhaust system is not necessary, even when the throat side sealing part 2190 is transferred. Therefore, the transfer chamber 124 can be formed in a compact structure.

<Ninth Embodiment of the Present Invention>

Figure 21:
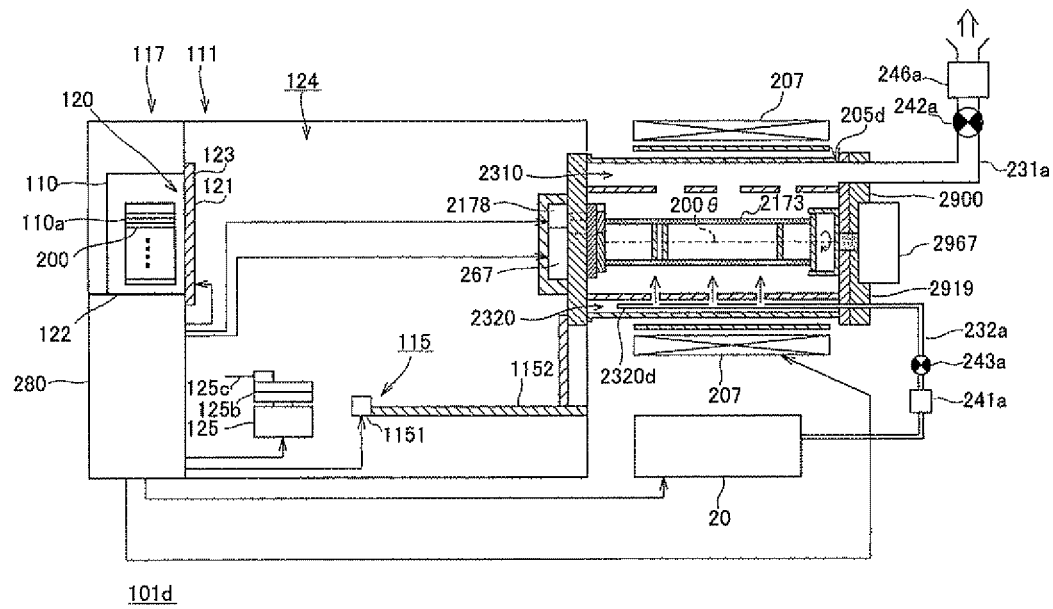
FIG. 21 is a view for explaining the substrate processing apparatus according to a ninth embodiment of the present invention.

FIG. 21 is a view for explaining a substrate processing apparatus 101d according to a ninth embodiment of the present invention. The ninth embodiment will be described hereafter, with reference to the drawings. Explanation for the structure similar to the structures of the first to eighth embodiments is omitted.

As shown in FIG. 21, according to this embodiment, a multihole nozzle 2320d is provided on the gas supply line (gas introduction tube) 232a. The multihole nozzle 2320d having one or more gas supply ports formed thereon, is provided between the inner wall of the processing tube 205d and the wafers 200 held by the substrate holder 217, extending along the arrangement direction of the wafers 200.

As shown in FIG. 21, the multihole nozzle 2320d may be provided in the gas supply part 2320 which is formed between the inner tube 204 and the outer tube 203 of the processing tube 205d, being a double tube.

Further, a diameter of each of the plurality of gas supply ports of the multihole nozzle 2320d may be set to supply the gas of approximately the same flow rate, to each of the plurality of wafers 200 held by the substrate holder 217.

(Effect of this Embodiment)

According to this embodiment, the multihole nozzle 2320d having one or more gas supply ports 2042e formed thereon, is provided between the inner wall of the processing tube 205d and the wafers 200 held by the substrate holder 217, extending along the arrangement direction of the wafers 200. A diameter of each of the plurality of gas supply ports 2042e is set to supply the gas of approximately the same flow rate, to each of the plurality of wafers 200 held by the substrate holder 217.

Therefore, the gas of approximately the same flow rate can be supplied to each of the plurality of wafers 200 held by the substrate holder 217.

Further, although not shown, the multihole nozzle for exhausting gas may also be provided in the gas exhaust part 2310 formed between the inner tube 204 and the outer tube 203 of the processing tube 205d, being a double tube. A diameter of each of the gas exhaust ports of the multihole nozzle for exhausting gas, may be set to supply the gas of approximately the same flow rate.

Further, for example, one or a plurality of multihole nozzles for supplying gas may be provided, for each kind of gas supplied to the wafers 200. Specifically, an oxygen gas supplying multihole nozzle, a hydrogen gas supplying multihole nozzle, and an inert gas supplying multihole nozzle, etc., may be provided.

<Tenth Embodiment of the Present Invention>

Figure 22:
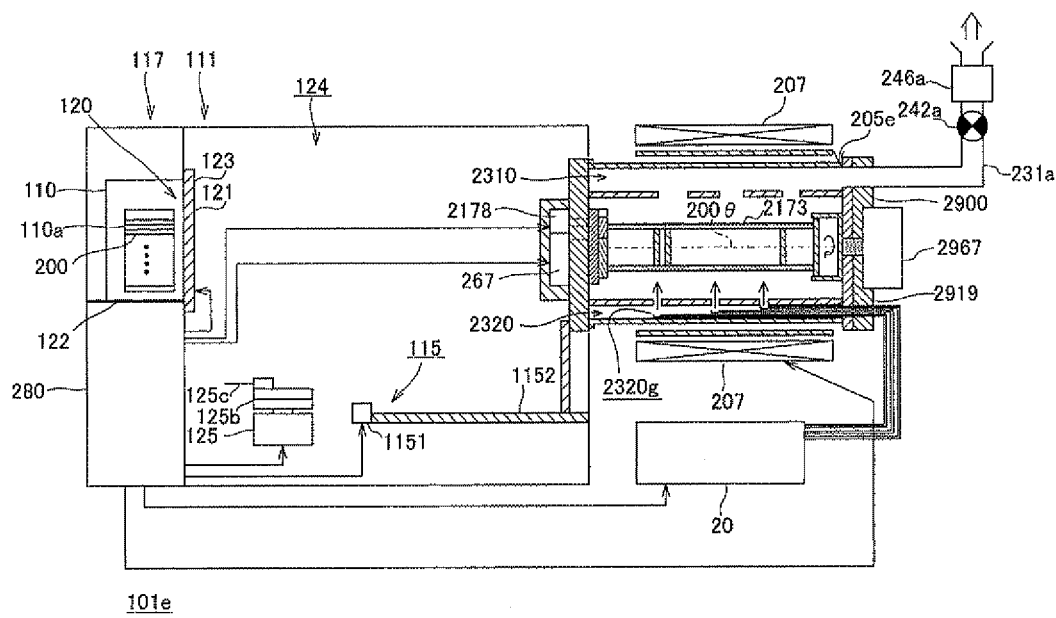
FIG. 22 is a view for explaining the substrate processing apparatus according to a tenth embodiment of the present invention.

FIG. 22 is a view for explaining a substrate processing apparatus 101e according to a tenth embodiment of the present invention. The tenth embodiment will be described hereafter, with reference to the drawings. Explanation for the structure similar to the structures of the first to ninth embodiments is omitted.

As shown in FIG. 22, according to this embodiment, a plurality of gas supply tubes 2320g having one gas supply port 2042e formed thereon, are provided between the inner wall of the processing tube 205e and the wafers 200 held by the substrate holder 217, extending along the arrangement direction of the wafers 200.

As shown in FIG. 22, the plurality of gas supply tubes 2320g having one gas supply port 2042e formed thereon, may also be provided in the gas supply part 2320 formed between the inner tube 204 and the outer tube 203 of the processing tube 205e.

Further, a diameter of each of the gas supply ports 2042e of each of the plurality of gas supply tubes 2320g may be set to supply the gas of approximately the same flow rate, to each of the plurality of wafers 200 held by the substrate holder 217.

(Effect of this Embodiment)

According to this embodiment, a plurality of gas supply tubes 2320g having one gas supply port 2042e, are provided between the inner wall of the processing tube 205e and the wafers 200 held by the substrate holder 217, extending in the arrangement direction of the wafers 200. The plurality of gas supply tubes 2320g having one gas supply port 2042e formed thereon, are provided in the gas supply part 2320 formed between the inner tube 204 and the outer tube 203 of the processing tube 205e, being a double tube. A diameter of each of the gas supply port 2042e of each of the plurality of gas supply tubes 2320g is set to supply the gas of approximately the same flow rate, to each of the plurality of wafers 200 held by the substrate holder 217.

Therefore, the gas of approximately the same flow rate can be supplied to each of the wafers 200 held by the substrate holder 217, with relatively a simple structure.

<Other Embodiment of the Present Invention>

Embodiments of the present invention have been specifically described above. However, the present invention is not limited to the aforementioned embodiments, and can be variously modified in a range of not departing from the gist of the present invention.

For example, the substrate processing apparatus of the present invention may also be applied to an apparatus for applying prescribed processing to a glass substrate such as an LCD (Liquid Crystal Display).

Further, in the aforementioned embodiments, both end portions of the substrate holder 217 are rotatably supported by the rotation support part (the rotation part 255 and the rotation support part 2955). However, the present invention is not limited to this embodiment. For example, only one of the end portions of the substrate holder 217 may be rotatably supported. Namely, for example, in a case of five or more wafers 200, the center of the wafers 200 is set so as not to be deviated from the rotation axis 200θ by its own weight of the substrate holder 217.

Further, in the ninth embodiment and the tenth embodiment, the double tube is employed as the processing tube 205. However, for example, the processing tube 205 as a single tube, may also be employed.

Further, in the ninth embodiment and the tenth embodiment, the gas supply tube and the gas exhaust tube may also be provided at both end portions or in the vicinity of the both end portions of the processing tube 205.

When an influence of a deflection can't be ignored, the present invention is particularly an effective invention wherein the thickness of the wafer is set based on the present standard (diameter: 300 mm, thickness: 775 μm), and for example, the diameter of the wafer is 350 mm or more.

Further, for example, generally the deflection of the wafer is reduced when the wafer is thicker. However, time is required for heating the wafer this time, thus posing a problem in film formation. Accordingly, the present invention is an effective invention when the deflection becomes larger than the present state, with an increase of the diameter of the wafer.

(Preferred Aspect of the Present Invention)

Preferred aspects of the present invention will be additionally described hereafter.

According to an aspect of the present invention, there is provided a substrate processing apparatus, comprising:

a substrate holder that holds a plurality of substrates in a state of being arranged approximately in a horizontal direction (lateral direction) approximately in a vertical posture (at equal intervals);

a processing tube that houses the substrate holder;

a sealing part that air-tightly closes an opening part of the processing tube;

a rotation part that rotates the substrate holder in a peripheral direction of the substrates with an arrangement direction of the plurality of substrates (a direction of holding the substrates) as a rotation axis, the substrate holder further comprising:

a fixing part that fixes the substrates approximately in the vertical posture.

Preferably, an angle formed by an arrangement direction of the substrates and a horizontal direction is set to not more than a prescribed angle.

Further preferably, the rotation part has a rotation axis, and the arrangement direction of the substrates is set as a longitudinal direction of the rotation axis, and an angle formed by the arrangement direction (the rotation axis) of the substrates and the horizontal direction is set to not less than a prescribed angle.

Further preferably, the angle formed by the arrangement direction (rotation axis) of the substrates and the horizontal direction, is set to an angle at which a stress added to the substrates is not more than a prescribed stress.

Further preferably, the angle formed by the arrangement direction (rotation axis) of the substrates and the horizontal direction is set to an angle at which a slip by the stress is not generated in the substrates.

Further preferably, the angle formed by the arrangement direction (rotation axis) of the substrates and the horizontal direction is set in a range of 0° to 30°.

Further preferably, there is provided a substrate processing apparatus, comprising:

a gas supply part having one or more gas supply ports formed thereon, between an inner wall of the processing tube and substrates held by the substrate holder, extending in an arrangement direction of the substrates; and a gas exhaust part having one or more gas exhaust ports at positions opposed to the gas supply ports through the substrates, between the inner wall of the processing tube and the substrates held by the substrate holder, extending along the arrangement direction of the substrates, wherein gas is supplied to surfaces (main surfaces) of the substrates by flowing the gas toward the gas exhaust ports from the gas supply ports.

Further preferably, a diameter of each of the plurality of gas supply ports is set to supply gas of approximately the same flow rate, to each of the plurality of substrates held by the substrate holder.

Further preferably, a diameter of each of the both or one of the plurality of gas supply ports and the plurality of gas exhaust ports is set to supply gas of approximately the same flow rate, to each of the plurality of substrates held by the substrate holder.

Further preferably, the processing tube comprises:

an inner tube that surrounds an outer periphery of the substrates held by the substrate holder, and an outer tube that surrounds an outer periphery of the inner tube, and a partitioning plate that partitions a space between the inner tube and the outer tube into a gas supply part and a gas exhaust part, extending along an arrangement direction of the plurality of substrates, and the inner tube comprises:

a gas supply port that allows communication between inside of the gas supply part and inside of the inner tube, and a gas exhaust port that allows communication between inside of the gas exhaust part and inside of the inner tube.

Further preferably, the sealing part includes a gas supply line that supplies gas to the gas supply part, and a gas exhaust line that exhausts the gas exhaust part.

Further preferably, both end portions of the substrate holder are rotatably supported by a rotation support part provided at both end portions of the processing tube.

Further preferably, both end portions along the rotation axial direction are rotatably supported by the rotation support part.

Further preferably, the substrate holder includes a plurality of struts for sandwiching a side face of the substrate.

Further preferably, the substrate holder comprises:

a fixture holding part that supports a side face of the substrate; and a movable holding part that can be displaced between a state that the substrates are fixed in a vertical posture by holding a portion of the side faces of the substrates different from a portion supported by the fixture holding part, and a state that the substrate can be removed.

Further preferably, a heater is provided so as to surround the processing tube.

Further preferably, the processing tube and the heater of the substrate are concentrically arranged.

Further preferably, a rotation axis of the rotation part is formed to coincide with centers of the substrate, the heater, and the processing tube, respectively.

According to other aspect of the present invention, there is provided a processing tube of the substrate processing apparatus.

According to further other aspect of the present invention, there is provided a fixing part of the substrate holder of the substrate processing apparatus.

According to further other aspect of the present invention, there is provided a manufacturing method of a semiconductor device, performed by a substrate processing apparatus having:

a substrate holder that holds a plurality of substrates in a state of being arranged approximately in a horizontal direction approximately in a vertical posture;

a processing tube that houses the substrate holder holding the substrates;

a sealing part that air-tightly closes an opening part of the processing tube in which the substrate holder is housed; and a rotation part provided to the sealing part, for rotating the substrate holder in a peripheral direction of the substrates, with an arrangement direction of the plurality of substrates as a rotation axis, the method comprising the steps of:

fixing the plurality of substrates by a fixing part provided to the substrate holder, in a state of being arranged approximately in a horizontal direction approximately in a vertical posture;

housing the substrate holder with the substrates fixed thereto, into the processing tube, and air-tightly closing an opening part of the processing tube by the sealing part; and processing the substrates by supplying gas into the processing tube, while rotating the substrate holder by the rotation part.

Preferably, the step of fixing the plurality of substrates by the fixing part of the substrate holder comprises the steps of:

holding the plurality of substrates by the substrate holder in a state of being arranged in a vertical direction in a horizontal posture;

fixing the plurality of substrates in a state of being arranged in the vertical direction in the horizontal posture by the fixing part of the substrate holder; and converting a posture of the substrate holder so that the substrates are set in approximately a vertical posture while fixing the plurality of substrates by the fixing part of the substrate holder.

DESCRIPTION OF SIGNS AND NUMERALS

20 Gas supply unit
101 Substrate processing apparatus
111 Casing
117 Front chamber
124 Transfer chamber
201 Processing chamber
202 Processing furnace
203 Outer tube
204 Inner tube
205 Processing tube
206 Partitioning plate
217 Substrate holder
217a Fixture holding part
217b Movable holding part (fixing part)
217h Holding groove
219 Seal flange (throat side seal flange)
231 Gas exhaust tube
232 Gas supply tube
242 APC valve
246 Vacuum pump
255 Rotation part
267 Rotation mechanism
280 Controller
2041 Gas exhaust port
2042 Gas supply port
2171a End plate (fixture holding part of throat flange side)
2172a End plate (tail tube flange side of fixture holding part)
2171c Endplate (throat flange side of movable holding part)
2172c End plate (tail tube flange side of movable holding part)
2178 Derive part
2190 Throat side sealing part (first sealing part or throat side mechanical flange part)
2310 Gas exhaust part
2320 Gas supply part
2900 Tail tube side sealing part (second sealing part or tail tube side mechanical flange part)
2919 Tail tube side seal flange

The invention claimed is:

1. A substrate processing apparatus, comprising:
a substrate holder that holds a plurality of substrates in a state of being arranged approximately in a horizontal direction approximately in a vertical posture;
a processing tube that houses the substrate holder;
a sealing part that air-tightly closes an opening part of the processing tube; and
a fixing part that fixes the plurality of substrates to the substrate holder approximately in the vertical posture, wherein:
the fixing part has a pair of end plates and one or more struts erected between the end plates,
the fixing part fixes the plurality of substrates to the substrate holder approximately in the vertical posture by sandwiching, with the struts, an upper side and a lower side of a side face of each substrate,
the end plates are respectively composed of an approximately semicircular shaped movable holding end part and an approximately semicircular shaped fixture holding part so that the end plates are circular shape with a straight line portion of the movable holding end part and a straight line portion of the fixture holding part aligned with each other, and
a rotation part for rotating the substrate holder is provided to the sealing part in a peripheral direction of the plurality of substrates, with an arrangement direction of the plurality of substrates as a rotation axis, so that the substrate holder is rotated by the rotation part, with the arrangement direction of the substrates as the rotation axis.

2. The substrate processing apparatus according to claim 1, wherein an angle formed by the arrangement direction of the substrate and the horizontal direction is set to not more than a prescribed angle.

3. The substrate processing apparatus according to claim 1, further comprising:
a gas supply part having one or more gas supply ports formed thereon, between an inner wall of the processing tube and the plurality of substrates held by the substrate holder, extending along the arrangement direction of the plurality of substrates; and
a gas exhaust part having one or more gas exhaust ports at a position opposed to the gas supply ports through the plurality of substrates, between the inner wall of the processing tube and the plurality of substrates held by the substrate holder, extending along the arrangement direction of the plurality of substrates.

4. The substrate processing apparatus according to claim 3, wherein a diameter of each of the plurality of gas supply ports is set to supply gas of approximately the same flow rate, to each of the plurality of substrates held by the substrate holder.

5. The substrate processing apparatus according to claim 1, further comprising:
an inner tube that surrounds an outer periphery of the plurality of substrates held by the substrate holder;
an outer tube that surrounds an outer periphery of the inner tube; and
a partitioning plate that partitions a space between the inner tube and the outer tube, into a gas supply part and a gas exhaust part, extending along an arrangement direction of the plurality of substrates.

6. The substrate processing apparatus according to claim 5, further comprising:
   a gas introduction line that introduces gas to the gas supply part; and
   a gas exhaust line that exhausts the gas exhaust part.

7. The substrate processing apparatus according to claim 6, wherein both end portions of the substrate holder along a direction of the rotation axis are rotatably supported by a rotation support part provided at both end portions of the processing tube respectively.

8. The substrate processing apparatus according to claim 5, wherein the inner tube comprises:
   a gas supply port that allows communication between the gas supply part and inside of the inner tube; and
   a gas exhaust port that allows communication between the gas exhaust part and inside of the inner tube.

9. A fixing part of the substrate holder of the substrate processing apparatus according to claim 1.

10. The substrate processing apparatus according to claim 1, further comprising
    a posture conversion and transfer mechanism for rotating the substrate holder around a horizontal axis in a state of holding the plurality of substrates,
    wherein the substrate holder is rotated by the posture conversion and transfer mechanism so that the plurality of substrates held by the substrate holder is approximately in the vertical posture.

* * * * *